United States Patent
Arisawa et al.

(10) Patent No.: US 11,281,108 B2
(45) Date of Patent: Mar. 22, 2022

(54) EXPOSURE DEVICE

(71) Applicant: SCREEN Holdings Co., Ltd., Kyoto (JP)

(72) Inventors: You Arisawa, Kyoto (JP); Masaya Asai, Kyoto (JP); Masahiko Harumoto, Kyoto (JP); Yuji Tanaka, Kyoto (JP); Chisayo Mori, Kyoto (JP); Tomohiro Motono, Kyoto (JP); Shuji Miyamoto, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 17/020,959

(22) Filed: Sep. 15, 2020

(65) Prior Publication Data
US 2021/0088911 A1    Mar. 25, 2021

(30) Foreign Application Priority Data

Sep. 19, 2019  (JP) .............................. JP2019-170831
Sep. 19, 2019  (JP) .............................. JP2019-170833

(51) Int. Cl.
*G03F 7/20*    (2006.01)

(52) U.S. Cl.
CPC .......... *G03F 7/70008* (2013.01); *G03F 7/707* (2013.01); *G03F 7/70483* (2013.01);
(Continued)

(58) Field of Classification Search
CPC ............. G03F 7/70008; G03F 7/70483; G03F 7/70883; G03F 7/70016; G03F 7/7005; G03F 7/70691; G03F 7/707; G03F 7/70716; G03F 7/70725; G03F 7/70733; G03F 7/7075; G03F 7/70758; G03F 7/70775; G03F 7/708; G03F 7/70808;
(Continued)

(56) References Cited

U.S. PATENT DOCUMENTS 4,749,436 A * 6/1988 Minato ................. G03F 7/2024
                                                    156/345.1
6,731,371 B1 * 5/2004 Shiraishi ............... G03B 27/52
                                                    250/492.2
(Continued)

FOREIGN PATENT DOCUMENTS

JP    2011-028184 A    2/2011
JP    2012-042931 A    3/2012
(Continued)

*Primary Examiner* — Christina A Riddle
(74) *Attorney, Agent, or Firm* — Ostrolenk Faber LLP

(57) ABSTRACT

An exposure device has a cylindrical peripheral wall member. The peripheral wall member forms a processing space in which a substrate is storable and has an upper opening and a lower opening. Further, a light emitter is provided in an upper portion of the peripheral wall member to close the upper opening. A lower lid member that is provided to be movable in an up-and-down direction and configured to be capable of closing and opening the lower opening is provided below the peripheral wall member. The atmosphere in the processing space is replaced with an inert gas with the substrate stored in the processing space and the lower opening closed by the lower lid member. In this state, vacuum ultraviolet rays are emitted to the substrate from the light emitter, and the substrate is exposed.

9 Claims, 21 Drawing Sheets

(52) U.S. Cl.
CPC ...... *G03F 7/70808* (2013.01); *G03F 7/70883* (2013.01); *G03F 7/70933* (2013.01)

(58) Field of Classification Search
CPC ............. G03F 7/70825; G03F 7/70833; G03F 7/7085; G03F 7/70858; G03F 7/70866; G03F 7/70908; G03F 7/70916; G03F 7/70925; G03F 7/70933; G03F 7/70991; G03F 7/20; G03F 7/2002; G03F 7/2004; G03F 7/2022; G03F 7/2024; G03F 7/2026; G03F 7/2051; G03F 7/26; G03F 7/38; G03F 7/40; G03F 7/70325; G03F 7/70375; G03F 7/70383; G03F 7/70416; G03F 7/70425; H01L 21/027; H01L 21/677; H01L 21/67225; H01L 21/67253; H01L 21/67748; H01L 21/6776; H01L 21/67115; H01L 21/67178

USPC ...... 355/30, 67–77; 250/492.1, 492.2, 493.1, 250/494.1, 503.1, 504 R; 430/8, 30, 311, 430/319, 320, 321, 327, 328, 346, 396, 430/401, 494

See application file for complete search history.

(56) References Cited

U.S. PATENT DOCUMENTS

| | | | |
|---|---|---|---|
| 2005/0175497 A1 | 8/2005 | Arai et al. | ........................ 422/3 |
| 2009/0245761 A1* | 10/2009 | Nakajima | ......... H01L 21/68707 |
| | | | 392/416 |
| 2013/0260546 A1* | 10/2013 | Yamada | ............ H01L 21/67115 |
| | | | 438/565 |
| 2016/0111318 A1* | 4/2016 | Ichinose | ............. H01L 21/6838 |
| | | | 430/322 |
| 2018/0223426 A1* | 8/2018 | Shono | ............... C23C 16/45502 |
| 2018/0253012 A1 | 9/2018 | Matsuo et al. | |
| 2018/0337076 A1* | 11/2018 | Nishide | ............. H01L 21/67115 |
| 2019/0086808 A1 | 3/2019 | Nakayama et al. | |

FOREIGN PATENT DOCUMENTS

| | | |
|---|---|---|
| JP | 2015-172775 A | 10/2015 |
| JP | 2017-037336 A | 2/2017 |
| JP | 2018-146617 A | 9/2018 |
| JP | 2018-159828 A | 10/2018 |
| JP | 2018-200420 A | 12/2018 |
| TW | 200407967 A | 5/2004 |
| TW | 201214052 A | 4/2012 |
| TW | 201833686 A | 9/2018 |
| TW | 201839522 A | 11/2018 |
| TW | 201925919 A | 7/2019 |

* cited by examiner

FIG. 28

| | SUPPLY FLOW RATE OF N2 GAS [L/min] | ELAPSED TIME [SECOND] | OXYGEN CONCENTRATION | PRESENCE OR ABSENCE OF OPENING AND COLLISION SURFACE |
|---|---|---|---|---|
| INVENTIVE EXAMPLE 1 | 10 | 19 | 1% OR LESS | PRESENT |
| INVENTIVE EXAMPLE 2 | 13 | 13 | 1% OR LESS | PRESENT |
| COMPARATIVE EXAMPLE 1 | 9 | 20 | 6% | ABSENT |

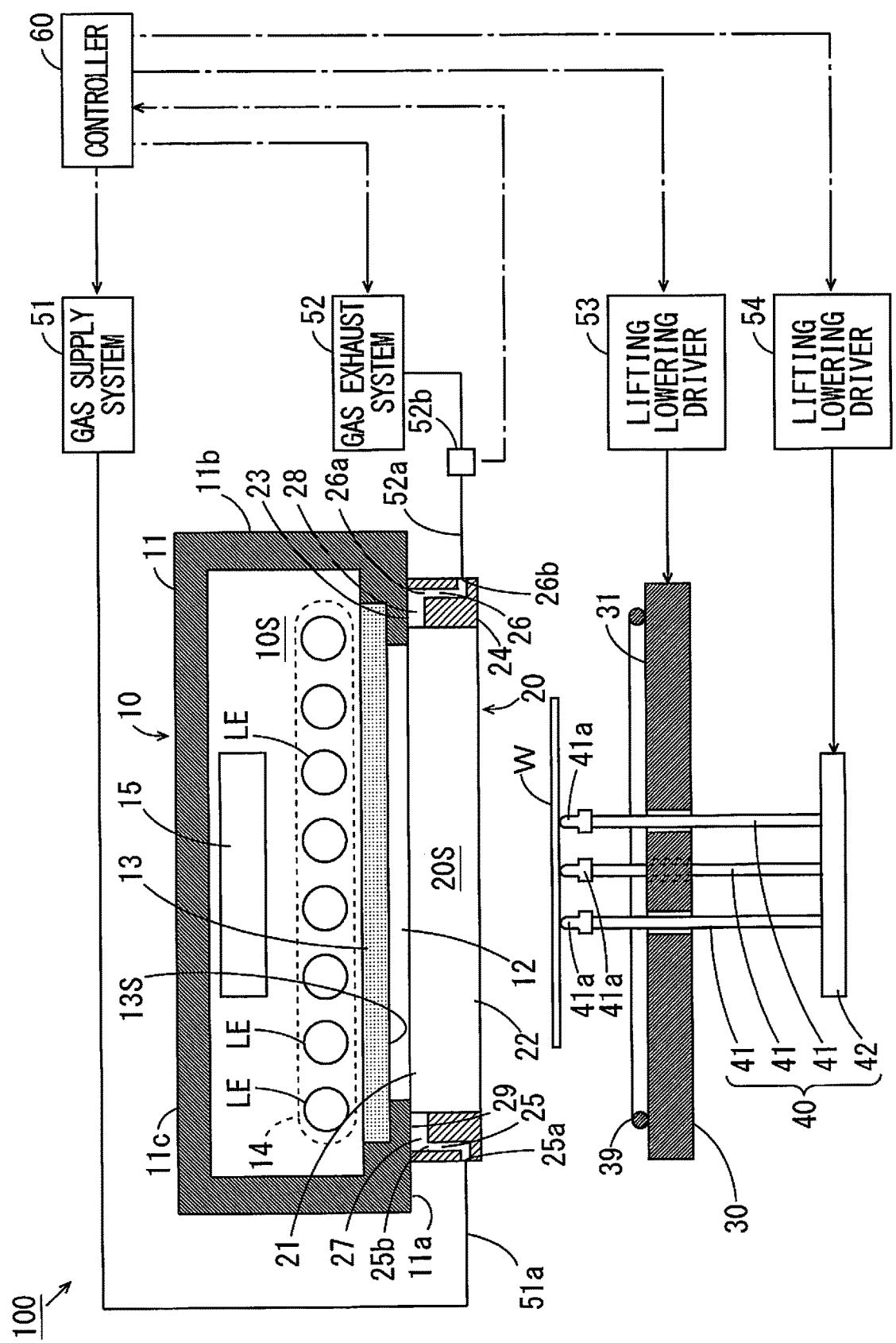

EXPOSURE DEVICE

BACKGROUND

Technical Field

The present invention relates to an exposure device that performs exposure processing on a substrate using vacuum ultraviolet rays.

Description of Related Art

Vacuum ultraviolet rays may be used to reform a film formed on a substrate. For example, in JP 2018-159828 A, an exposure device that performs exposure processing on a film including a Directed Self Assembly material on a substrate using vacuum ultraviolet rays is described.

The exposure device includes a processing chamber, a light projector and a closure. The processing chamber has an upper opening and an inner space. The light projector is arranged above the processing chamber to close the upper opening of the processing chamber. A transport opening through which the substrate is transported between the inside and outside of the processing chamber is formed in a side surface of the processing chamber. The closure is configured to be capable of opening and closing the transport opening using a shutter.

When exposure processing is performed on the substrate, the transport opening is first opened, and the substrate is carried into the processing chamber through the transport opening. Next, with the substrate arranged in the processing chamber, the transport opening is closed, and the inner space of the processing chamber is sealed. Further, in order to reduce attenuation of vacuum ultraviolet rays with which the substrate is irradiated due to oxygen, the atmosphere in the processing chamber is replaced with an inert gas. When the oxygen concentration in the processing chamber is lowered to a predetermined concentration, the substrate is irradiated with vacuum ultraviolet rays through the upper opening of the processing chamber. Thus, the film on the substrate is reformed. Thereafter, the transport opening is opened again, and the exposed substrate is carried out to the outside of the processing chamber.

SUMMARY

As described above, in the exposure device described in JP 2018-159828 A, it is necessary to replace the atmosphere in the processing chamber with the inert gas until the oxygen concentration in the processing chamber reaches the predetermined concentration each time exposure processing is performed on one substrate. In this case, it is desirable that the period of time required for replacement of the atmosphere in the processing chamber is shortened in order to improve efficiency of the exposure processing.

Further, as described above, in the exposure device described in JP 2018-159828 A, the exposure processing is performed in a low oxygen atmosphere. As such, the entire atmosphere in the processing chamber in which the substrate is exposed is replaced with the inert gas. However, it may require a long period of time until the atmosphere is replaced uniformly with the inert gas. When the atmosphere is replaced non-uniformly with the inert gas, accuracy of exposure processing is reduced. Further, when the period of time required for replacement of the inert gas is lengthened, efficiency of the exposure processing is reduced.

An object of the present invention is to provide an exposure device that can improve efficiency of exposure processing without reducing cleanliness of a substrate with a simple and compact configuration.

Another object of the present invention is to provide an exposure device that can improve accuracy and efficiency of exposure processing.

An exposure device according to one aspect of the present invention that performs exposure processing on a substrate that is at least partially circular, includes a cylindrical peripheral wall member that forms a processing space in which the substrate is storable and has an upper opening and a lower opening, a light emitter that has an emission surface that is provided above the peripheral wall member to close the upper opening of the peripheral wall member and emittable of vacuum ultraviolet rays to the processing space, a closing member that is provided to be movable in an up-and-down direction below the peripheral wall member and configured to be capable of closing and opening the lower opening, a substrate supporter that supports the substrate between the emission surface and the closing member such that the substrate faces the emission surface, a supplier that supplies an inert gas to the processing space with the substrate supported by the substrate supporter in the processing space and the lower opening closed by the closing member in the processing space, and an exhauster that exhausts an atmosphere in the processing space to outside of the processing space with the substrate supported by the substrate supporter and the lower opening closed by the closing member in the processing space.

In this exposure device, the substrate is supported between the emission surface and the closing member such that the substrate faces the emission surface of the light emitter. The lower opening of the peripheral wall member is closed by the closing member, and the atmosphere in the processing space is replaced with the inert gas. In this state, vacuum ultraviolet rays are emitted from the emission surface of the light emitter to the substrate, and the substrate is exposed. When the substrate is exposed, the oxygen concentration in the processing space is lowered by the inert gas. Thus, attenuation of vacuum ultraviolet rays emitted from the emission surface of the light emitter to the substrate is reduced.

With the above-mentioned configuration, because the peripheral wall member has a cylindrical shape corresponding to the shape of the substrate, a volume of the processing space can be reduced. Thus, the atmosphere in the processing space can be replaced with the inert gas quickly. Therefore, the oxygen concentration in the processing space can be lowered in a short period of time.

Further, a corner portion in which gas stays is not present in the processing space formed by the cylindrical peripheral wall member. Therefore, when the atmosphere in the processing space is replaced with the inert gas, a smooth flow of gas is formed along the inner peripheral surface of the peripheral wall member. Thus, particles are not likely to remain in the processing space. Therefore, cleanliness of the substrate in the processing space can be improved.

Further, the closing member opens and closes the lower opening of the peripheral wall member, whereby the substrate can be carried into the processing space and carried out from the processing space. The closing member moves in the up-and-down direction, whereby the lower opening can be opened and closed with a simple configuration and a simple operation. Therefore, it is not necessary to provide a carry-in carry-out port for the substrate in the peripheral wall member or to provide a complicated mechanism for opening and closing the carry-in carry-out port.

As a result, it is possible to improve efficiency of the exposure processing without reducing the cleanliness of the substrate with a simple and compact configuration.

A first gas flow path and a second gas flow path that communicate with outside of the peripheral wall member and the processing space may be formed inside of the peripheral wall member, the supplier may be provided to be capable of supplying the inert gas into the processing space through the first gas flow path, and the exhauster may be provided to be capable of exhausting the atmosphere in the processing space to the outside of the processing space through the second gas flow path.

In this case, it is not necessary to provide a member such as a pipe or a nozzle for supplying the inert gas into the processing space. Further, in the processing space, it is not necessary to provide a member such as a pipe or a nozzle for exhausting the atmosphere in the processing space to the outside of the processing space. Thus, a region that interferes with a flow of gas in the processing space is reduced, so that particles are unlikely to remain in the processing space.

The first gas flow path and the second gas flow path may be respectively formed in portions of the peripheral wall member that are opposite to each other with the processing space located therebetween.

In this case, in the processing space, a smooth flow of gas is formed from the first gas flow path toward the second gas flow path. Thus, because the atmosphere in the processing space is smoothly replaced with the inert gas, the period of time required for replacement of the atmosphere is shortened. Further, because an occurrence of turbulence in the processing space is suppressed, the oxygen concentration in a plurality of portions in the processing space can be kept uniformly. Therefore, the substrate can be exposed uniformly.

The closing member may have a flat upper surface facing the emission surface, and a plurality of the substrate supporters may be attached to the upper surface of the closing member.

In this case, because the plurality of substrate supporters are commonly attached to the flat upper surface of the closing member, the positions of the plurality of substrate supporters in the up-and-down direction can be adjusted easily and accurately when the plurality of substrate supporters are attached to the closing member. Thus, the substrate supported by the substrate supporter is prevented from being inclined with respect to the emission surface, and the substrate can be exposed uniformly.

The exposure device may further include a plurality of support pins that extend in the up-and-down direction at a position below the processing space and respectively have a plurality of upper ends that are capable of supporting the substrate, wherein the closing member may have a plurality of through holes into which the plurality of support pins are inserted, the plurality of support pins may be provided such that the upper ends of the plurality of support pins are located at positions farther downward than upper ends of the plurality of substrate supporters when the lower opening is closed by the closing member, and may be provided such that the upper ends of the plurality of support pins are located at positions farther upward than the upper ends of the plurality of substrate supporters when the lower opening is opened by the closing member.

In this case, when the substrate is carried into the processing space, the substrate is placed on the upper ends of the plurality of support pins from the outside of the exposure device at a position below the processing space with the lower opening opened by the closing member. Thereafter, when the lower opening is closed by the closing member, the closing member moves upwardly with respect to the plurality of support pins. Thus, the upper ends of the plurality of substrate supporters are moved to positions farther upward than the upper ends of the plurality of support pins. Thus, the substrate is transferred from the plurality of support pins to the plurality of substrate supporters, and the substrate is supported in the processing space.

On the other hand, when the substrate is carried out from the processing space, the closing member moves downwardly with respect to the plurality of support pins. Thus, the upper ends of the plurality of substrate supporters move to positions farther downward than the upper ends of the plurality of support pins. Thus, the substrate is transferred from the plurality of substrate supporters to the plurality of support pins, and the substrate is supported below the processing space. In this manner, the closing member is moved in the up-and-down direction, whereby the substrate can be carried into and out from the processing space with a simple configuration and a simple operation.

The exposure device may further include a controller that controls the light emitter and the supplier, wherein the controller may control the supplier such that the inert gas is supplied into the processing space at a first flow rate in a predetermined first time that is from a point in time at which the substrate is supported by the substrate supporter in the processing space and the lower opening is closed by the closing member, may control the supplier such that the inert gas is supplied into the processing space at a second flow rate that is lower than the first flow rate in a second time that is from a point in time at which the first time elapses, and may control the light emitter such that the substrate is irradiated with vacuum ultraviolet rays from the emission surface in the second time.

With the above-mentioned control, after the lower opening is closed, the inert gas is supplied into the processing space at a relatively high first flow rate before exposure of the substrate, and the atmosphere in the processing space is exhausted. Thus, large part of the atmosphere in the processing space can be replaced with the inert gas in a short period of time.

Thereafter, the inert gas is supplied into the processing space at a relatively low second flow rate when the substrate is exposed, and the atmosphere in the processing space is exhausted. In this case, generation of a flow of gas in the processing space is suppressed. Thus, scattering of particles remaining in the processing space during exposure of the substrate due to a flow of the inert gas is prevented. Therefore, an occurrence of processing defects caused by scattering of particles in the processing space during exposure of the substrate is prevented.

An exposure device according to another aspect of the present invention that performs exposure processing on a substrate, includes a peripheral wall member that forms a processing space in which the substrate is storable and has an upper opening, a light emitter that closes the upper opening and has an emission surface that is emittable of vacuum ultraviolet rays, and a substrate supporter that supports the substrate in the processing space below the light emitter when exposure is carried out by the light emitter, wherein the peripheral wall member has a flow path that guides an inert gas from below to above and an opening that causes the flow path and the processing space to communicate with each other, the opening has a first side surface and a second side surface that face each other, a distance between the first side surface and the second side surface gradually becomes larger from a downstream end portion of the flow path to the processing space, and a collision surface with which the inert gas that flows out to the opening from the downstream end portion of the flow path collides is provided, and the collision surface is located at a position farther upward than the substrate supported by the substrate supporter when exposure is carried out.

With the above-mentioned configuration, the inert gas reaches the downstream end portion through the flow path formed in the peripheral wall member. The inert gas supplied from the downstream end portion to the opening flows along the first and second side surfaces into the processing space after colliding with the collision surface that is located at a position farther upward than the substrate. In this case, the atmosphere between the light emitter and the substrate can be replaced uniformly. Further, it is not necessary to replace the entire atmosphere in the processing space. Therefore, the period of time required for replacement can be shortened. As a result, efficiency and accuracy of the exposure processing can be enhanced.

The peripheral wall member may be cylindrical. In this case, a corner portion in which gas stays is not present in the processing space formed by the cylindrical peripheral wall member. Therefore, when the atmosphere in the processing space is replaced with the inert gas, a smooth flow of gas is formed along the inner peripheral surface of the peripheral wall member. Thus, the period of time required for replacement can be more sufficiently shortened, and the inert gas used for replacement can be suppressed.

The peripheral wall member may include an exhauster that exhausts an atmosphere in the processing space. In this case, the atmosphere in the processing space is exhausted by the exhauster, whereby a flow of the inert gas can be formed more easily in the processing chamber. Therefore, the period of time required for uniform replacement of the atmosphere above the substrate in the processing space can be more sufficiently shortened.

The collision surface may be constituted by part of a lower surface of the light emitter. In this case, part of the lower surface of the light emitter that closes the upper opening of the peripheral wall member is used as the collision surface, so that it is not necessary to provide the collision surface separately. Therefore, a manufacturing cost for the exposure device can be suppressed.

The collision surface may be provided in the peripheral wall member. In this case, part of the peripheral wall member is used as the collision surface, so that it is not necessary to provide the collision surface separately. Therefore, the manufacturing cost for the exposure device can be suppressed.

A lower opening may be formed in the peripheral wall member, and the exposure device may further include a closing member that is configured to be capable of closing and opening the lower opening, and a lifting lowering driver that controls the closing member such that the closing member moves to a first position below the lower opening when the substrate is received or transferred between outside and the substrate supporter and the closing member moves to a second position at which the closing member closes the lower opening when the substrate is exposed.

In this case, the closing member moves to the first position below the processing space when the substrate is received and transferred. Thus, the substrate can be received and transferred easily between the outside and the substrate supporter. Further, when the substrate is exposed, the closing member moves to the second position above the first position. Thus, the lower opening can be closed easily.

The substrate supporter may be provided at an upper surface of the closing member. In this case, the substrate supporter moves in the up-and-down direction together with the closing member. Thus, the substrate can be easily placed on the substrate supporter below the processing space from the outside of the exposure device. Further, when the substrate is exposed, the substrate supporter moves upwardly. Thus, the substrate becomes close to the light emitter. Thus, efficiency of the exposure processing of the substrate can be more sufficiently improved.

Other features, elements, characteristics, and advantages of the present invention will become more apparent from the following description of preferred embodiments of the present invention with reference to the attached drawings.

BRIEF DESCRIPTION OF THE DRAWING

FIG. 28 is a diagram showing a result of comparison among an inventive example 1, an inventive example 2 and a comparative example 1; and FIG. 29 is a schematic cross sectional view showing the configuration of an exposure device according to another embodiment.

DETAILED DESCRIPTION

An exposure device according to embodiments of the present invention will be described below with reference to drawings. In the following description, a substrate refers to a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate, a substrate for a solar cells or the like. A substrate described below is a substrate that is at least partially circular and is a circular substrate in which a notch or an orientation flat, for example, is formed. Further, a film that is to be reformed by vacuum ultraviolet rays is formed on a main surface of the substrate.

Further, in the below-mentioned exposure device, with the main surface of the substrate directed upwardly and the back surface (the surface on the opposite side of the main surface) of the substrate directed downwardly, the main surface of the substrate is irradiated with ultraviolet rays having a wavelength of not less than about 120 nm and not more than about 230 nm (hereinafter referred to as vacuum ultraviolet rays) from above. Therefore, in the following description, an upper surface of the substrate is the main surface of the substrate, and a lower surface of the substrate is the back surface of the substrate.

[A] First Embodiment

[1] Configuration of Exposure Device

Figure 1:
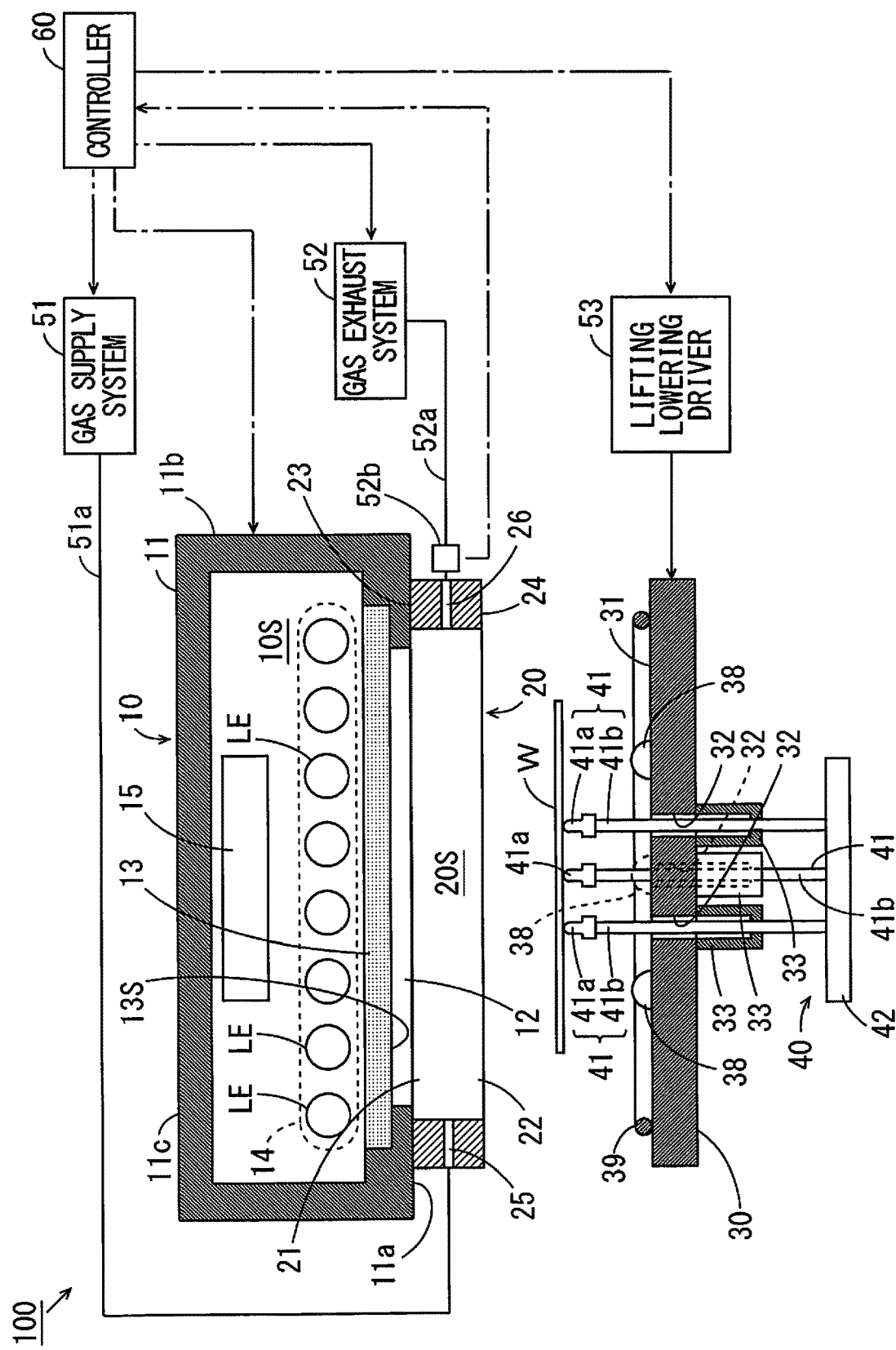
FIG. 1 is a schematic cross sectional view showing the configuration of an exposure device according to a first embodiment of the present invention.
Figure 2:
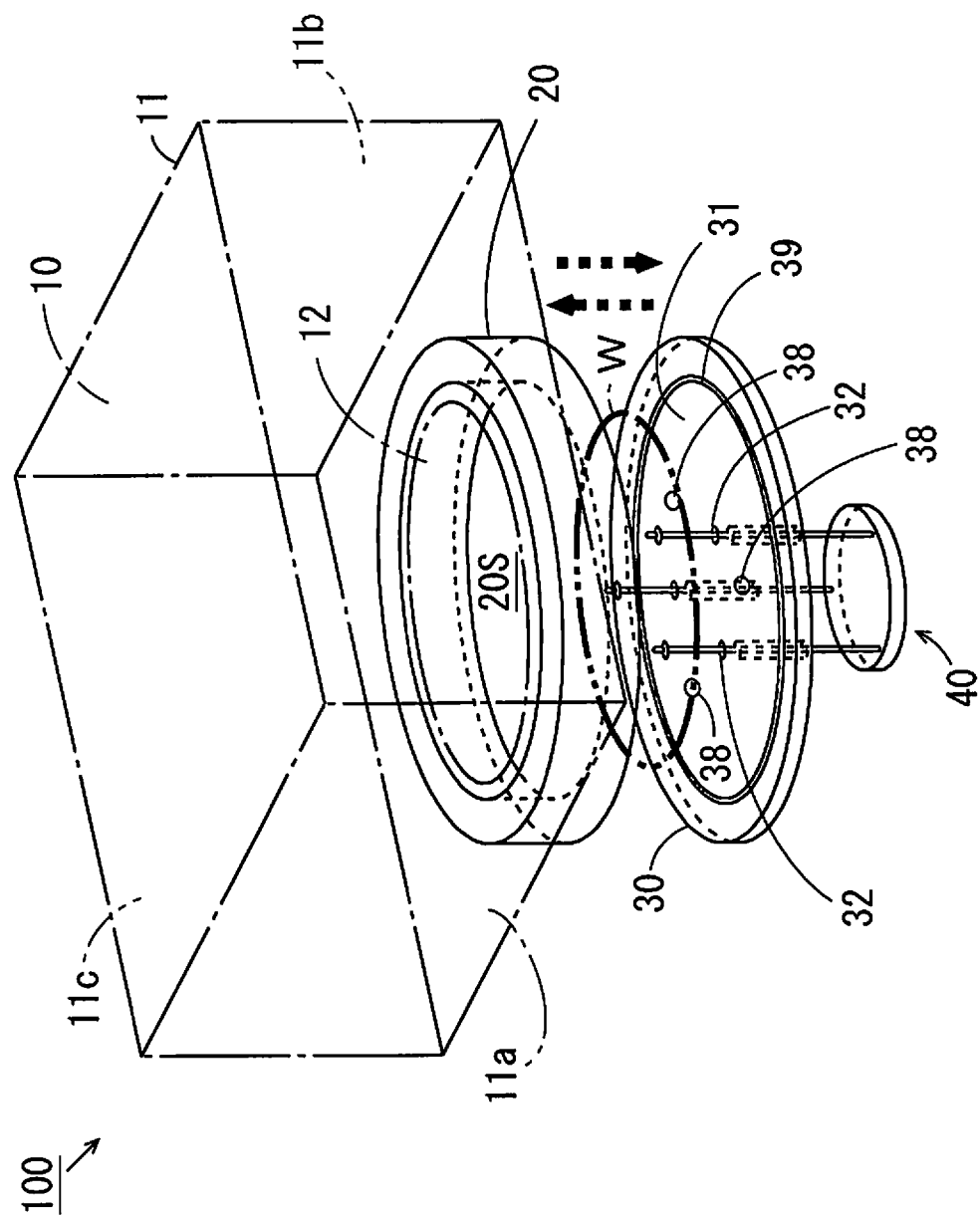
FIG. 2 is a perspective view for explaining the operation of part of the constituent elements of the exposure device of FIG. 1.

FIG. 1 is a schematic cross sectional view showing the configuration of an exposure device according a first embodiment, and FIG. 2 is a perspective view for explaining the operation of part of the constituent elements of the exposure device 100 of FIG. 1. As shown in FIG. 1, the exposure device 100 includes a light emitter 10, a peripheral wall member 20, a lower lid member 30, a substrate supporting mechanism 40, a gas supply system 51, a gas exhaust system 52, a lifting lowering driver 53 and a controller 60.

In the exposure device 100, a processing space 20S in which exposure processing is performed on the substrate W is formed by the peripheral wall member 20. Specifically, the peripheral wall member 20 has a flat cylindrical shape. The space surrounded by an inner peripheral surface of the peripheral wall member 20 is used as the processing space 20S. Further, the peripheral wall member 20 has an upper end surface 23 and a lower end surface 24 that are flat and annular. An upper opening 21 is formed inwardly of the upper end surface 23, and a lower opening 22 is formed inwardly of the lower end surface 24.

The light emitter 10 is provided above the peripheral wall member 20 to close the upper opening 21 of the peripheral wall member 20. The light emitter 10 includes a housing 11, a light-transmitting plate 13, a planar light source 14 and a power supply device 15.

The housing 11 has a bottom wall portion 11a, a peripheral wall portion 11b having a square tube shape and a ceiling portion 11c. An inner space 10S is formed of the bottom wall portion 11a, the peripheral wall portion 11b and the ceiling portion 11c. In FIG. 2, only the housing 11 of the light emitter 10 is indicated by one-dot and dash lines.

As shown in FIG. 1, a lower opening 12 is formed in the bottom wall portion 11a of the housing 11. The lower opening 12 is circular, for example. The inner diameter of the lower opening 12 is slightly smaller than that of the peripheral wall member 20. The light-transmitting plate 13 is attached to the bottom wall portion 11a to close the lower opening 12. In the present embodiment, the light-transmitting plate 13 is a quartz glass plate. As a material for the light-transmitting plate 13, another material that transmits vacuum ultraviolet rays may be used.

The light source 14 and the power supply device 15 are stored in the inner space 10S of the housing 11. The light source 14 has the configuration in which a plurality of bar-shape light source elements LE that emit vacuum ultraviolet rays are arranged horizontally at predetermined intervals. Each light source element LE may be a xenon excimer lamp, or may be another excimer lamp or a deuterium lamp, for example. The power supply device 15 supplies electric power to the light source 14.

The upper end surface 23 of the peripheral wall member 20 is connected to the lower surface of the bottom wall portion 11a such that a lower surface of the light-transmitting plate 13 is directed toward the processing space 20S as an emission surface 13S. With such a configuration, vacuum ultraviolet rays generated from the light source 14 are emitted into the processing space 20S through the emission surface 13S.

The lower lid member 30 is provided to be movable in an up-and-down direction below the peripheral wall member 20. Further, the lower lid member 30 is configured to be capable of closing and opening the lower opening 22 by moving in the up-and-down direction. Hereinafter, the position at which the lower lid member 30 closes the lower opening 22 is referred to as a lid closing position, and the position at which the lower lid member 30 opens the lower opening 22 is referred to as a lid opening position. The lifting lowering driver 53 includes a stepping motor, for example, and moves the lower lid member 30 in the up-and-down direction between the lid closing position and the lid opening position as indicated by the thick dotted arrows in FIG. 2.

The lower lid member 30 has a flat upper surface 31 facing the emission surface 13S of the light emitter 10. As shown in FIG. 1, a sealing member 39 is attached to the upper surface 31 of the lower lid member 30. With the lower lid member 30 located at the lid closing position, the sealing member 39 adheres to a portion surrounding the lower opening 22 of the lower end surface 24 of the peripheral wall member 20. The sealing member 39 is made of an O-ring, for example.

Further, a plurality (three in the present example) of support members 38 that are configured to be capable of supporting the lower surface of the substrate W are attached to the upper surface 31 of the lower lid member 30. Each support member 38 is a spherical proximity ball and is formed of ceramic, for example.

Further, a plurality of through holes 32 respectively corresponding to a plurality of support pins 41, described below, are formed in the center portion of the lower lid member 30. Further, a plurality of storage pipes 33 are provided at the portions in which the plurality of through holes 32 are formed in the lower surface of the lower lid member 30 to extend downwardly by a certain distance. Each storage pipe 33 has an inner diameter equal to the inner diameter of a through hole 32. An inward flange that is formed to extend from the inner peripheral surface of a storage pipe 33 toward its axial center is formed at the lower end of the storage pipe 33.

The substrate supporting mechanism 40 includes a plurality (three in the present example) of support pins 41 and a pin coupling member 42. Each support pin 41 includes a tip member 41a and a support shaft 41b. The plurality of support shafts 41b are respectively provided to extend in the up-and-down direction and are respectively inserted into the plurality of through holes 32 of the lower lid member 30 and the plurality of storage pipes 33. The pin coupling member 42 couples the lower ends of the plurality of support shafts 41b to one another and is fixed to a base portion (not shown) of the exposure device 100. The plurality of tip members 41a are respectively provided at the upper ends of the plurality of support shafts 41b and are formed of ceramic or resin, for example.

In a case where the lower lid member 30 is located at the lid opening position, the plurality of tip members 41a (the upper ends of the plurality of support pins 41) are located at positions farther upward than the upper ends of the plurality of support members 38 attached to the lower lid member 30. Thus, as shown in FIG. 1, the substrate W to be processed is supported on the plurality of tip members 41a. At this time, the upper surface of the substrate W faces the emission surface 13s of the light emitter 10.

When the lower lid member 30 moves upwardly from the lid opening position toward the lid closing position, the plurality of tip members 41a of the substrate supporting mechanism 40 are stored in the storage pipe 33 through the plurality of through holes 32 of the lower lid member 30. Therefore, in a case where the lower lid member 30 is located at the lid closing position, the plurality of tip members 41a (the upper ends of the plurality of support pins 41) are located at positions farther downward than the upper ends of the plurality of support members 38 attached to the lower lid member 30. Thus, the substrate W supported on the plurality of tip members 41a are transferred to the plurality of support members 38.

Here, an outward flange having a diameter larger than the diameter of the support shaft 41b is formed at each tip member 41a of the substrate supporting mechanism 40. Meanwhile, in the upper surface portion of an inward flange formed at the lower end of each of the plurality of storage pipes 33, a sealing member (not shown) that can come into contact with the lower surface of an outward flange of a tip member 41a is provided. These sealing members are made of O-rings, for example. Further, when the lower lid member 30 is located at the lid closing position, each sealing member blocks a flow of gas between the processing space 20S, the inner spaces of the through holes 32 and the inner spaces of the storage pipes 33, and the outside of the processing space 20S. Thus, the processing space 20S is sealed.

The gas supply system 51 of FIG. 1 includes a pipe 51a, an inert gas supply source (not shown), a valve (not shown) and the like. Further, the gas exhaust system 52 includes a pipe 52a, a valve (not shown), gas exhaust equipment (not shown) and the like.

A first gas flow path 25 and a second gas flow path 26 that communicate with the outside of the peripheral wall member 20 and the processing space 20S are formed inside of the peripheral wall member 20. In the peripheral wall member 20, the first gas flow path 25 and the second gas flow path 26 are formed to be opposite to each other with the processing space 20S located therebetween (see FIG. 3, described below).

Each of the first and second gas flow paths 25, 26 are constituted by a through hole that is formed to extend from the outer peripheral surface to the inner peripheral surface of the peripheral wall member 20. The pipe 51a that extends from the gas supply system 51 is connected to the first gas flow path 25. The pipe 52a that extends from the gas exhaust system 52 is connected to the second gas flow path 26.

The gas supply system 51 supplies an inert gas to the processing space 20S through the pipe 51a and the first gas flow path 25 from an inert gas supply source (not shown). In the present embodiment, a nitrogen gas is used as the inert gas. The gas exhaust system 52 exhausts the atmosphere in the processing space 20S of the peripheral wall member 20 to the outside of the peripheral wall member 20 through the second gas flow path 26 and the pipe 52a.

An oxygen concentration meter 52b is provided in the pipe 52a. The oxygen concentration meter 52b measures the oxygen concentration of the gas flowing through the pipe 52a as an oxygen concentration and supplies the measured oxygen concentration to the controller 60 in a predetermined period. The oxygen concentration meter 52b is a galvanic cell type oxygen sensor or a zirconia oxygen sensor, for example.

The controller 60 is constituted by a CPU (Central Processing Unit) and a memory, for example. Various control programs are stored in the memory of the controller 60. The CPU of the controller 60 executes a control program stored in the memory, whereby the operation of each constituent element in the exposure device 100 is controlled as indicated by the one-dot and dash arrows in FIG. 1.

Figure 3:
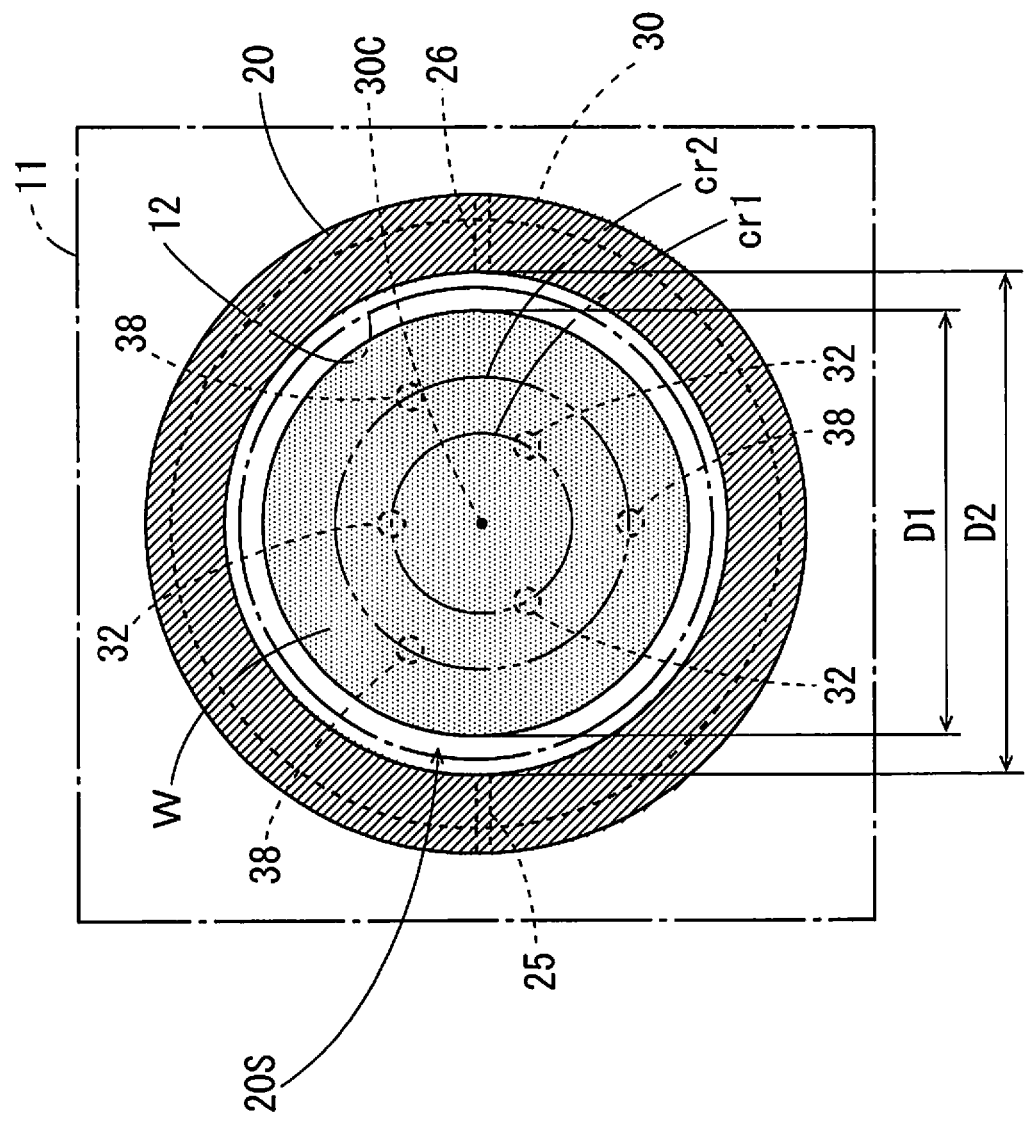
FIG. 3 is a schematic plan view showing part of the constituent elements of the exposure device of FIG. 1.
Figure 4:
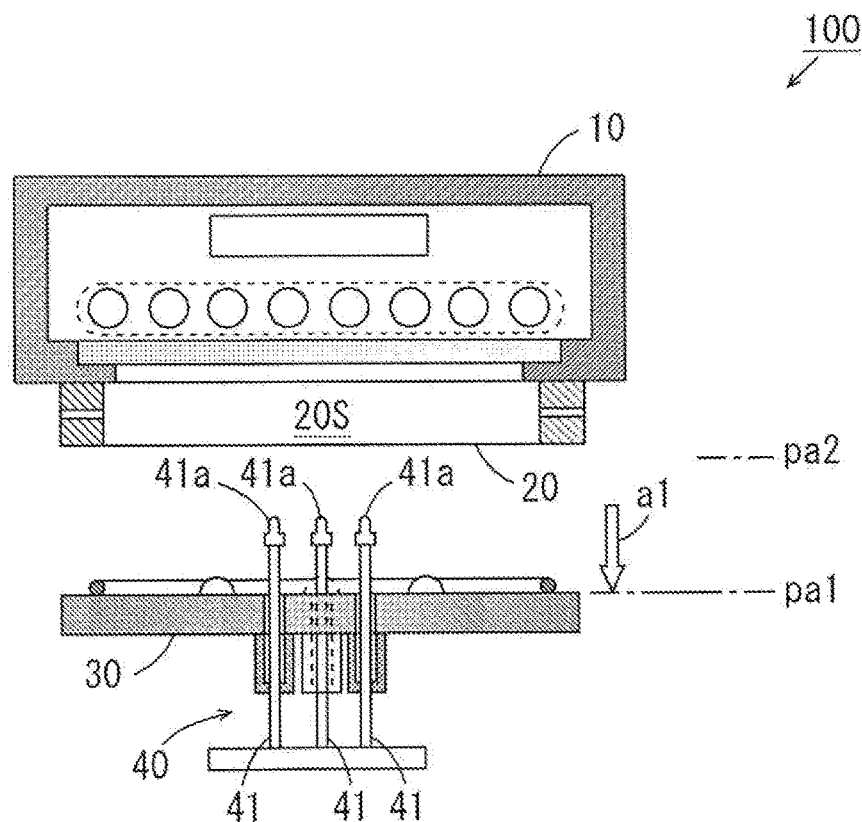
FIG. 4 is a schematic side view for explaining the basic operation of the exposure device according to the first embodiment when exposure processing is performed.
Figure 5:
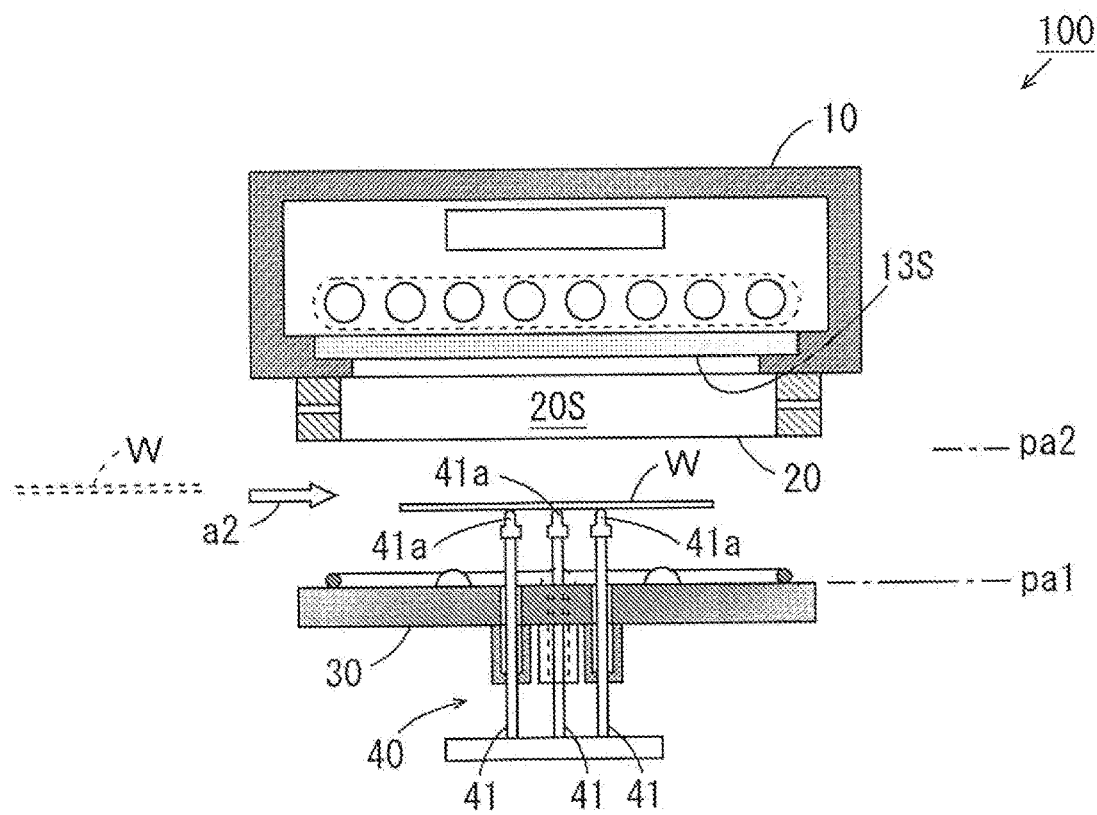
FIG. 5 is a schematic side view for explaining the basic operation of the exposure device according to the first embodiment when the exposure processing is performed.

FIG. 3 is a schematic plan view showing part of the constituent elements of the exposure device 100 of FIG. 1. In FIG. 3, the outer shape of the housing 11 of the light emitter 10 and the lower opening 12 are indicated by the one-dot and dash lines. Further, in FIG. 3, a dotted pattern is applied to the substrate W and hatching is applied to the peripheral wall member 20 to facilitate understanding of the relationship between the substrate W stored in the processing space 20S and the peripheral wall member 20 in regards to their positions and sizes.

As shown in FIG. 3, when the exposure processing is performed, the substrate W is supported by the substrate supporting mechanism 40 (FIG. 1) to be located substantially in the center portion of the processing space 20S. In this state, the inner peripheral surface of the peripheral wall member 20 faces the outer peripheral end of the substrate W. Further, the distance between the outer peripheral end of the substrate W and the inner peripheral surface of the peripheral wall member 20 is kept substantially constant.

Further, in FIG. 3, the three through holes 32 formed in the lower lid member 30 and the three support members 38 attached to the lower lid member 30 are indicated by the dotted lines. As shown in FIG. 3, the three through holes 32 are formed on a first virtual circle cr1 centered at a center 30C of the lower lid member 30 in a plan view at equal intervals. On the other hand, the three support members 38 are formed on a second virtual circle cr2 centered at the center 30C of the lower lid member 30 in a plan view at equal intervals. Here, the second virtual circle cr2 is larger than the first virtual circle cr1 and has the diameter that is about half of the diameter of the substrate W. Thus, when the substrate W is supported by the three support members 38, stability of support of the substrate W is improved as compared to a case where the substrate W is supported by the three through holes 32.

Here, in a case where a diameter D1 of the substrate W to be exposed by the exposure device 100 is 300 mm, an inner diameter D2 of the peripheral wall member 20 is larger than 300 mm and not more than 400 mm, for example, is preferably larger than 300 mm and not more than 350 mm, and is more preferably larger than 300 mm and not more than 320 mm. The inner diameter D2 of the peripheral wall member 20 of the present example is 310 mm.

Further, the thickness (height) of the peripheral wall member 20 is larger than 5 mm and not more than 50 mm, for example, and is preferably larger than 5 mm and not more than 20 mm. The thickness (height) of the peripheral wall member 20 of the present example is 10 mm.

[2] Basic Operation of Exposure Device 100 when Exposure Processing is Performed As described above, in the exposure device 100 according to the present embodiment, the substrate W to be processed is irradiated with vacuum ultraviolet rays having a wavelength of 172 nm, for example, whereby the exposure processing is performed. Here, in a case where a large amount of oxygen is present in the path of vacuum ultraviolet rays toward the substrate W, oxygen molecules absorb vacuum ultraviolet rays and are separated into oxygen atoms, and the separated atoms are recoupled with other oxygen molecules. Thus, ozone is generated. In this case, the vacuum ultraviolet rays that arrive at the substrate W attenuate. The attenuation of the vacuum ultraviolet rays is larger than that of ultraviolet rays having a wavelength larger than about 230 nm. As such, in the exposure device 100 according to the present embodiment, the substrate W is irradiated with vacuum ultraviolet rays in the processing space 20S in which the oxygen concentration is maintained low. The basic operation of the exposure device 100 when the exposure processing is performed will be described below.

FIGS. 4 to 9 are schematic side views for explaining the basic operation of the exposure device 100 according to the first embodiment when the exposure processing is performed. In FIGS. 4 to 9, the lid opening position pa1 and the lid closing position pa2 are respectively shown as the height position of the upper surface 31 (FIG. 1) of the lower lid member 30.

In an initial state before power is applied to the exposure device 100, the lower lid member 30 is at the lid closing position pa2. When the power supply of the exposure device 100 is in an ON state, the lower lid member 30 moves to the lid opening position pa1 as indicated by the outlined arrow a1 in FIG. 4.

Next, with the plurality of tip members 41a of the substrate supporting mechanism 40 located at positions farther downward than the peripheral wall member 20, the substrate W is carried into the exposure device 100 from the outside of the exposure device 100. In this case, as indicated by the outlined arrow a2 in FIG. 5, the substrate W that is transported by a transport device (not shown) is inserted into the space between the peripheral wall member 20 and the plurality of tip members 41a from a position farther sideward than the exposure device 100 and placed on the plurality of tip members 41a. In this state, the upper surface of the substrate W faces the emission surface 13S of the light emitter 10 with the processing space 20S located therebetween. The above-mentioned transport device is a transport device 220 of FIG. 15, described below, for example.

Figure 6:
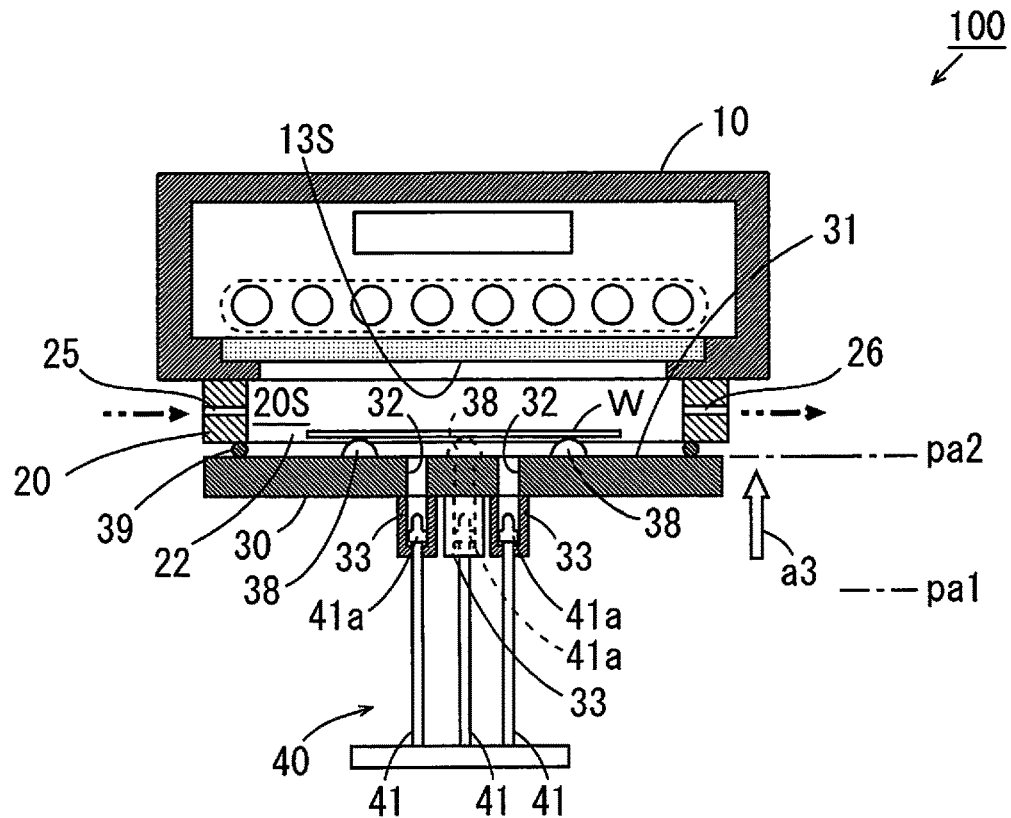
FIG. 6 is a schematic side view for explaining the basic operation of the exposure device according to the first embodiment when the exposure processing is performed.

Next, as indicated by the outlined arrow a3 in FIG. 6, the lower lid member 30 moves to the lid closing position pa2. Thus, with the substrate W stored in the processing space 20S, the lower opening 22 of the peripheral wall member 20 is closed by the lower lid member 30. Further, in the processing space 20S, the substrate W is supported by the plurality of support members 38. Further, the lower ends of the plurality of storage pipes 33 provided at the lower lid member 30 are closed by the plurality of tip members 41a and a sealing member (not shown). Thus, the processing space 20S is sealed.

In this state, as indicated by the thick one-dot and dash arrows in FIG. 6, the inert gas is supplied into the processing space 20S through the first gas flow path 25 from the gas supply system 51 of FIG. 1. Further, the atmosphere in the processing space 20S is exhausted to the outside of the exposure device 100 through the second gas flow path 26 by the gas exhaust system 52. Thus, the atmosphere in the processing space 20S is temporarily replaced with the inert gas, and the oxygen concentration in the processing space 20S is lowered.

Figure 7:
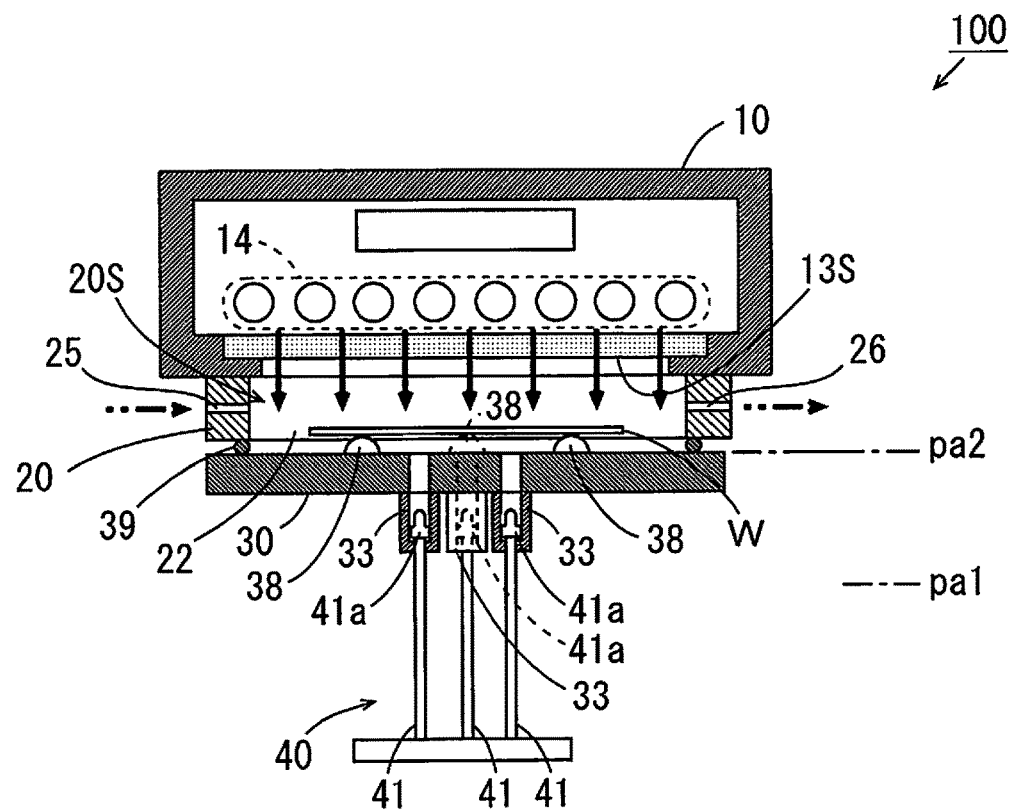
FIG. 7 is a schematic side view for explaining the basic operation of the exposure device according to the first embodiment when the exposure processing is performed.

Thereafter, the oxygen concentration in the processing space 20S is lowered to a predetermined concentration (hereinafter referred to as a target oxygen concentration), the upper surface of the substrate W is irradiated with vacuum ultraviolet rays from the light source 14 of the light emitter 10 through the emission surface 13S as indicated by the thick solid arrows in FIG. 7. Here, the target oxygen concentration is set such that the concentration of ozone in the vicinity of the peripheral wall member 20 is not more than a predetermined allowable concentration (0.1 ppm) when the lower opening 22 of the peripheral wall member 20 is opened after the exposure processing, for example. The target oxygen concentration is set to 1%, for example. Whether the oxygen concentration in the processing space 20S is lowered to the target oxygen concentration can be determined based on a signal output from the oxygen concentration meter 52b of FIG. 1, for example. During a period in which the substrate W is irradiated with vacuum ultraviolet rays, the operation of replacing the atmosphere in the processing space 20S with the inert gas may be continuously performed or stopped.

When the radiant exposure of vacuum ultraviolet rays with which the substrate W is irradiated (energy of vacuum ultraviolet rays with which a unit area on the substrate is irradiated) reaches a predetermined set radiant exposure, irradiation of the upper surface of the substrate W with vacuum ultraviolet rays is stopped. The upper surface of the substrate W is exposed in this manner, whereby the film formed on the substrate W is reformed in accordance with a predetermined exposure condition.

Here, irradiance of vacuum ultraviolet rays with which the substrate W is irradiated in an environment of the target oxygen concentration (a work rate of vacuum ultraviolet rays with which a unit area on the substrate is irradiated) is known. In this case, the radiant exposure of vacuum ultraviolet rays with which the substrate W is irradiated is defined based on the irradiance of vacuum ultraviolet rays and a period of time in which the substrate W is irradiated with vacuum ultraviolet rays. In the present embodiment, whether the radiant exposure of vacuum ultraviolet rays with which the substrate W is irradiated has reached the predetermined set radiant exposure is determined based on whether a period of time corresponding to the set radiant exposure (an exposure time) has elapsed since the irradiation with vacuum ultraviolet rays is started.

Figure 8:
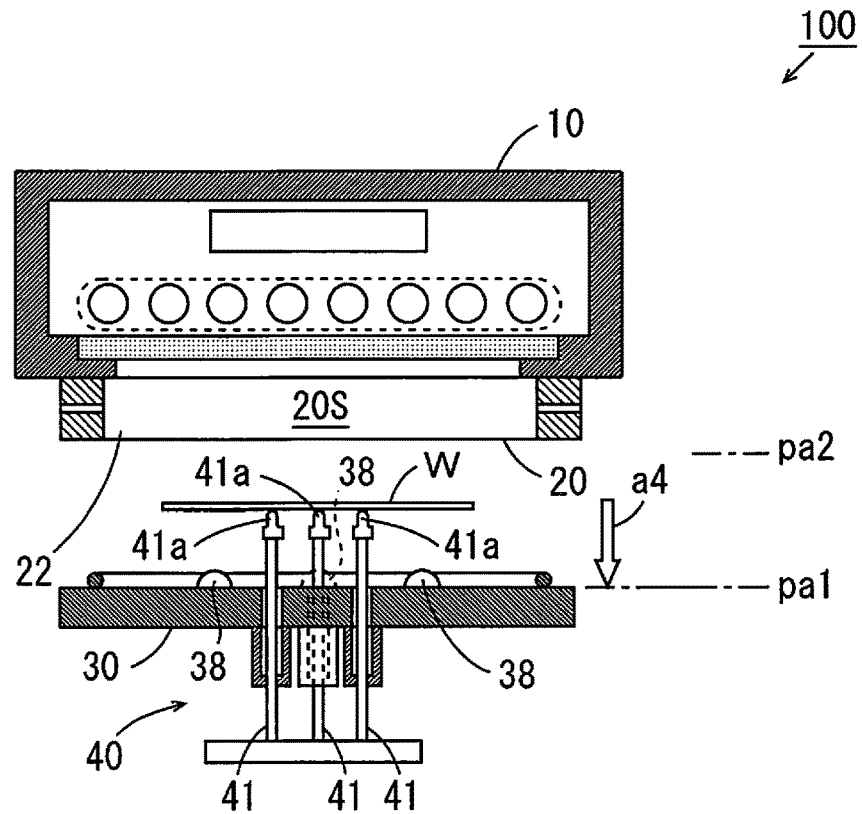
FIG. 8 is a schematic side view for explaining the basic operation of the exposure device according to the first embodiment when the exposure processing is performed.

After irradiation of the upper surface of the substrate W with vacuum ultraviolet rays is stopped, the lower lid member 30 moves to the lid opening position pa1 as indicated by the outlined arrow a4 in FIG. 8. Thus, the lower opening 22 of the peripheral wall member 20 is opened, and the substrate W is taken out to a position below the processing space 20S while being supported on the plurality of tip members 41a.

Figure 9:
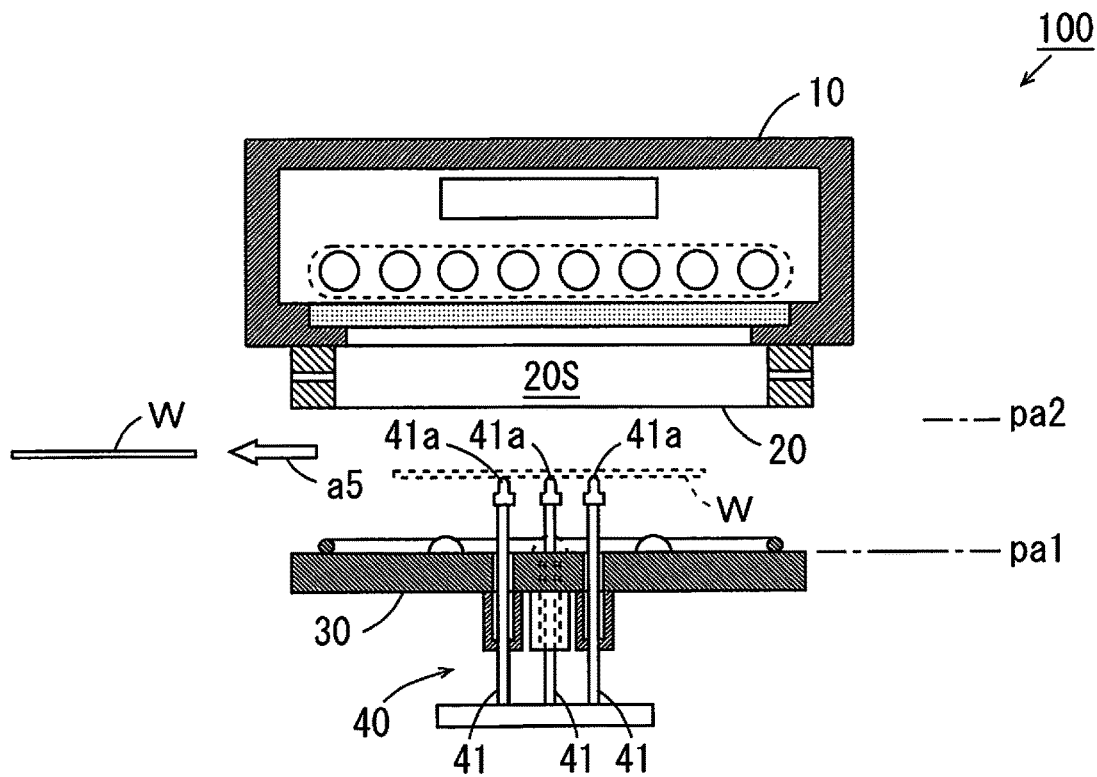
FIG. 9 is a schematic side view for explaining the basic operation of the exposure device according to the first embodiment when the exposure processing is performed.

Finally, as indicated by the outlined arrow a5 in FIG. 9, the substrate W supported on the plurality of tip members 41a are received by a transport device (not shown) and carried out to a position farther sideward than the exposure device 100. The above-mentioned transport device is the transport device 220 of FIG. 15, described below, for example.

Figure 10:
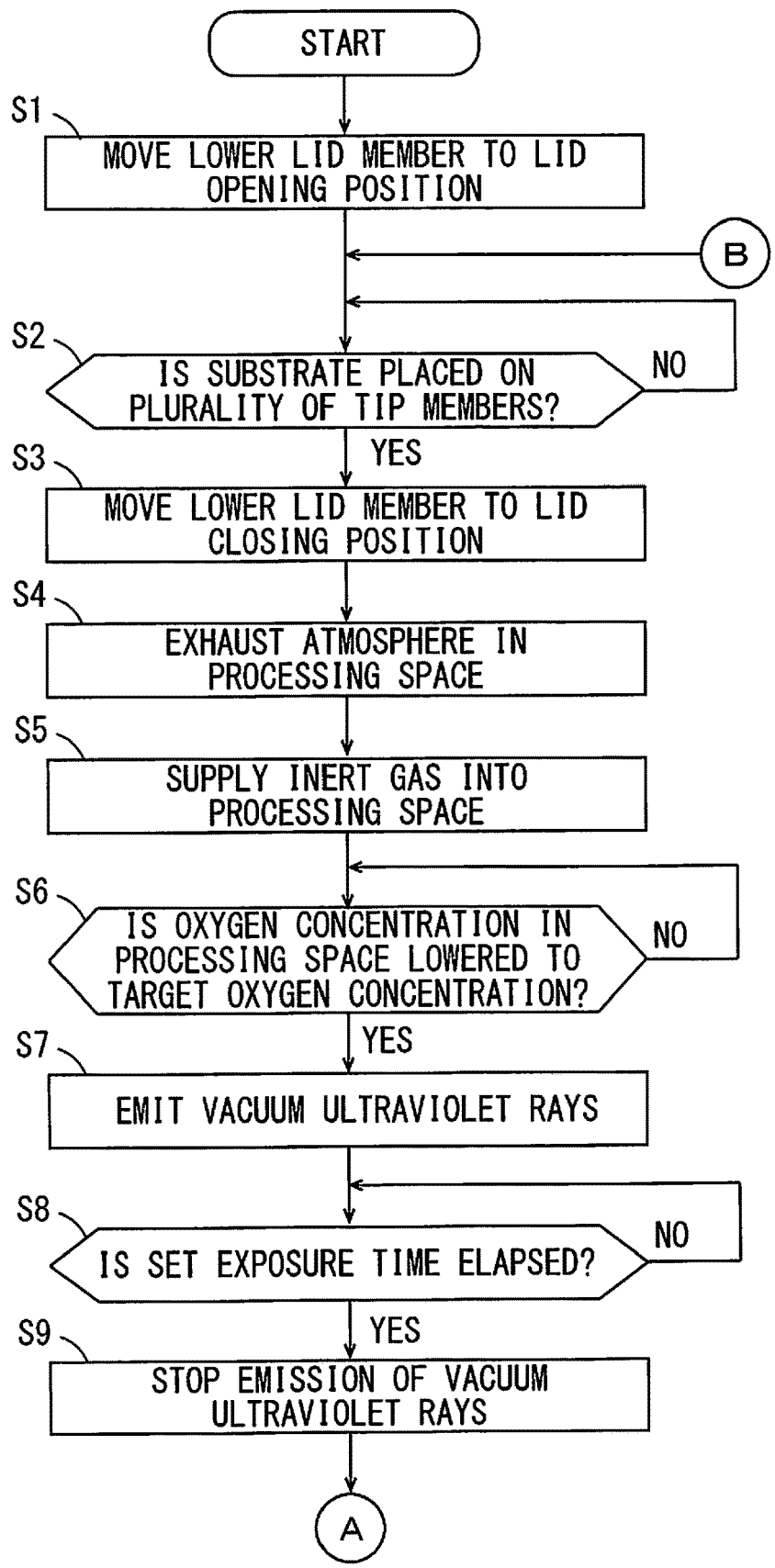
FIG. 10 is a flow chart showing a series of processes, which a controller of FIG. 1 performs in order to realize the operation of the exposure device of FIGS. 4 to 9.
Figure 11:
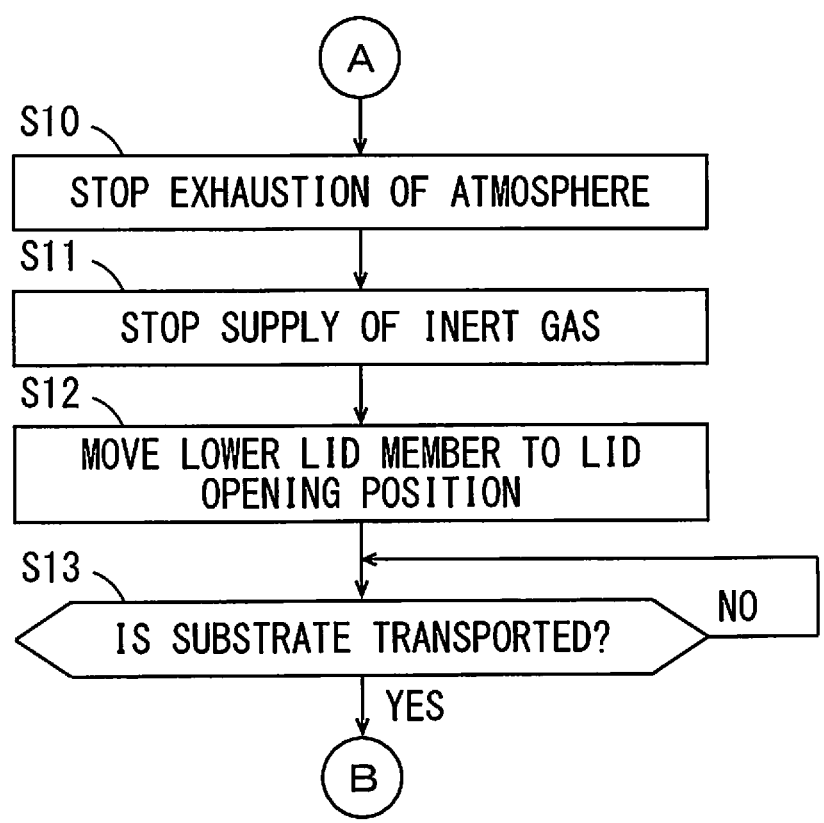
FIG. 11 is a flow chart showing the series of processes, which the controller of FIG. 1 performs in order to realize the operation of the exposure device of FIGS. 4 to 9.

[3] Series of Processes Performed by Controller 60 when Exposure Processing is Performed FIGS. 10 and 11 are flow charts showing a series of processes performed by the controller 60 of FIG. 1 in order to realize the operation of the exposure device 100 according to the first embodiment of FIGS. 4 to 9. The series of processes shown in FIGS. 10 and 11 starts when the power supply of the exposure device 100 is switched from the OFF state to the ON state, for example. First, the controller 60 moves the lower lid member 30 to the lid opening position pa1 by controlling the lifting lowering driver 53 of FIG. 1 (step S1).

Next, the controller 60 determines whether the substrate W is placed on the plurality of tip members 41a (step S2). A sensor for detecting presence or absence of the substrate W on the substrate supporting mechanism 40 (a photo electric sensor, for example) may be provided in the exposure device 100, for example, and this determination may be made based on the output from the sensor. Alternatively, this determination may be made based on an instruction signal from a control device outside of the exposure device 100 (a control device 210 of FIG. 15, described below, for example).

In a case where the substrate W is not placed on the plurality of tip members 41a, the process of the step S2 is repeated until the substrate W is placed on the tip members 41a of the plurality of support pins 41. On the other hand, when the substrate W is placed on the plurality of tip members 41a, the controller 60 moves the lower lid member 30 to the lid closing position pa2 by controlling the lifting lowering driver 53 of FIG. 1 (step S3).

Next, the controller 60 exhausts the atmosphere in the processing space 20S of the peripheral wall member 20 by controlling the gas exhaust system 52 of FIG. 1 (step S4). Further, the controller 60 supplies the inert gas into the processing space 20S of the peripheral wall member 20 by controlling the gas supply system 51 of FIG. 1 (step S5). The process of one of the steps S4, S5 may be performed first, or the processes of the respective steps S4 and S5 may be performed simultaneously.

Next, the controller 60 determines whether the oxygen concentration in the processing space 20S is lowered to the target oxygen concentration based on the oxygen concentration measured by the oxygen concentration meter 52b of FIG. 1 (step S6).

In a case where the oxygen concentration in the processing space 20S is not lowered to the target oxygen concentration, the controller 60 repeats the process of the step S6 until the oxygen concentration in the processing space 20S reaches the target oxygen concentration. On the other hand, in a case where the oxygen concentration in the processing space 20S is lowered to the target oxygen concentration, the controller 60 causes the light source 14 to emit vacuum ultraviolet rays toward the substrate W in the processing space 20S by controlling the light emitter 10 of FIG. 1 (step S7). Thus, the substrate W is irradiated with vacuum ultraviolet rays, and the film formed on the substrate W is reformed.

Next, the controller 60 determines whether the above-mentioned set exposure time has elapsed since a time point in which the light source 14 started to emit vacuum ultraviolet rays (step S8). In a case where the set exposure time has not elapsed, the controller 60 repeats the process of the step S8 until the set exposure time elapses. On the other hand, when the set exposure time elapses, the controller 60 stops the emission of vacuum ultraviolet rays in the light emitter 10 (step S9).

Next, the controller 60 stops exhaustion of the atmosphere in the processing space 20S by controlling the gas exhaust system 52 of FIG. 1 (step S10). Further, the controller 60 stops the supply of the inert gas into the processing space 20S by controlling the gas supply system 51 of FIG. 1 (step S11). The process of one of the steps S9, S10 and S11 may be performed first, or the processes of all of the steps S9, S10 and S11 may be performed simultaneously.

Next, the controller 60 moves the lower lid member 30 to the lid opening position pa1 by controlling the lifting lowering driver 53 of FIG. 1 (step S12). Thereafter, the controller 60 determines whether the substrate W is transported from the plurality of tip members 41a (step S13). Similarly to the process of the step S2, a sensor for detecting presence or absence of the substrate W on the substrate supporting mechanism 40 (a photo electric sensor, for example) may be provided in the exposure device 100, for example, and this determination may be made based on the output from the sensor. Alternatively, this determination may be made based on an instruction signal provided from a control device outside of the exposure device 100 (a control device 210 of FIG. 15, described below, for example). In a case where the substrate W is not transported, the controller 60 repeats the process of the step S13 until the substrate W is transported. On the other hand, when the substrate W is transported, the controller 60 returns to the process of the above-mentioned step S2.

[4] Method of Replacing Atmosphere in Processing Space 20S

As described above, in the exposure device 100, the atmosphere in the processing space 20S is exhausted, the inert gas is supplied into the processing space 20S and the atmosphere in the processing space 20S is replaced with the inert gas, whereby the oxygen concentration in the processing space 20S is lowered.

Figure 12:
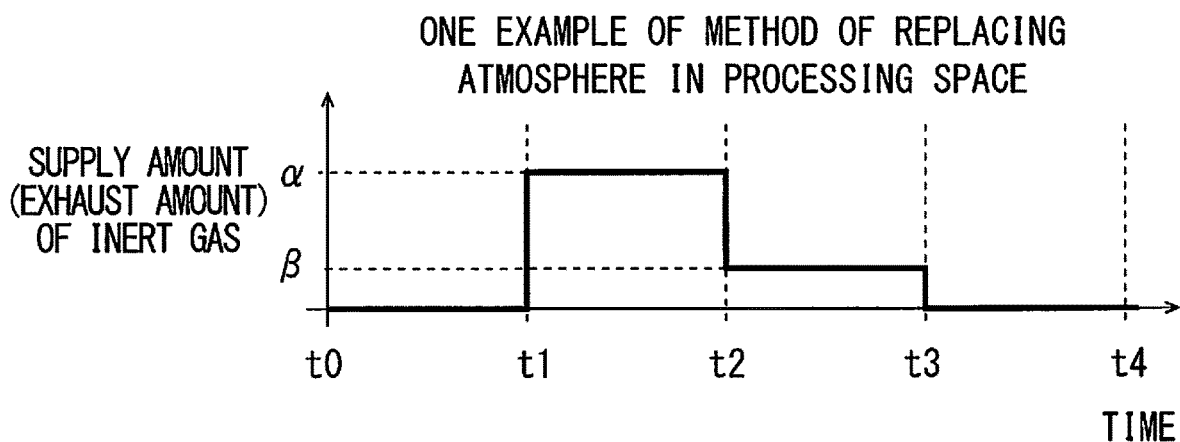
FIG. 12 is a diagram for explaining one example of a method of replacing the atmosphere in a processing space.

FIG. 12 is a diagram for explaining one example of the method of replacing the atmosphere in the processing space 20S. In FIG. 12, the temporal change of the amount of inert gas to be supplied to the processing space 20S when exposure processing is performed is shown in the graph. In the present embodiment, the amount of inert gas to be supplied to and exhausted from the processing space 20S during exposure processing are equal to each other. In FIG. 12, the abscissa indicates the supply amount of the inert gas, and the ordinate indicates the time.

In regard to the time axis of FIG. 12, the substrate W is carried into the exposure device 100 at a point t0 in time. At a point t1 in time, the carried substrate W is stored in the processing space 20S, and the lower opening 22 of the peripheral wall member 20 is closed by the lower lid member 30. At a point t2 in time, irradiation of the substrate W in the processing space 20S with vacuum ultraviolet rays starts. At a point t3 in time, irradiation of the substrate W in the processing space 20S with vacuum ultraviolet rays stops. Further, at a point t4 in time, the lower opening 22 of the peripheral wall member 20 is opened.

In the example of FIG. 12, the supply amount (and the exhaust amount) of the inert gas is maintained at 0 from the point t0 to the point t1 in time. Then, the supply amount (and the exhaust amount) of the inert gas is maintained at a relatively high value $\alpha$ from the point t1 to point t2 in time, and the supply amount (and the exhaust amount) of the inert gas is maintained at a value $\beta$ that is lower than the value $\alpha$ from the point t2 to the point t3 in time. Thereafter, the supply amount (and the exhaust amount) of the inert gas is maintained at 0 from the point t3 to the point t4 in time.

With such a replacement method, the inert gas is supplied into the processing space 20S at a relatively high flow rate (value $\alpha$) from the point t1 to the point t2 in time before exposure of the substrate W, and the atmosphere in the processing space 20S is exhausted. Thus, a large part of the atmosphere in the processing space 20S can be replaced with the inert gas. That is, the oxygen concentration can be lowered in a short period of time.

Thereafter, the inert gas is supplied into the processing space 20S at a relatively low flow rate (value $\beta$) when the substrate W is exposed. In this case, generation of a flow of gas in the processing space is suppressed. Thus, scattering of particles remaining in the processing space 20S caused by a flow of the inert gas during exposure of the substrate W is prevented. Therefore, an occurrence of processing defects caused by scattering of particles in the processing space 20S during exposure of the substrate W is prevented.

Figure 13:
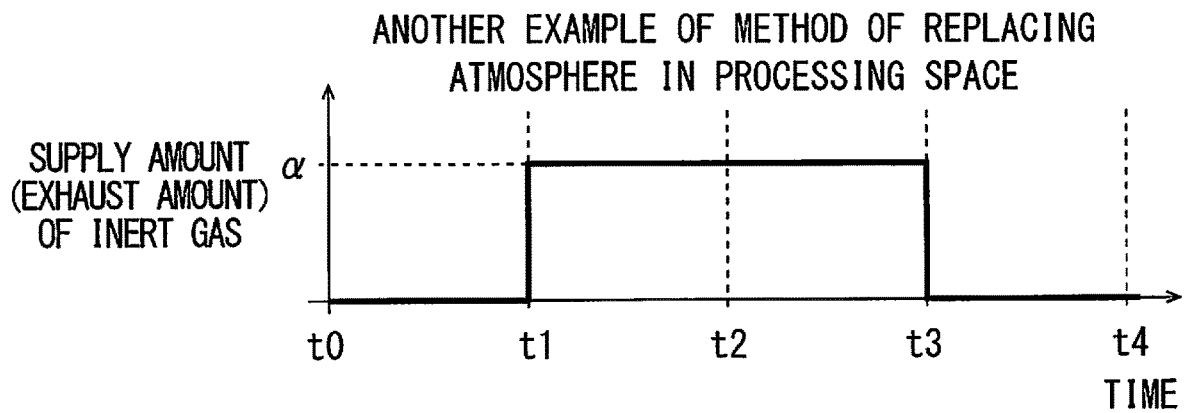
FIG. 13 is a diagram for explaining another example of the method of replacing the atmosphere in the processing space.

FIG. 13 is a diagram for explaining another example of a method of replacing the atmosphere in the processing space 20S. In FIG. 13, the temporal change of the supply amount of the inert gas to be supplied to the processing space 20S when exposure processing is performed is shown in a graph similarly to the example of FIG. 12. In regard to the time axis of FIG. 13, the points t0, t1, t2, t3 and t4 in time are the same as the points t0, t1, t2, t3 and t4 in time in FIG. 12.

In the example of FIG. 13, the supply amount (and the exhaust amount) of the inert gas is maintained at 0 from the point t0 to the point t1 in time. Then, the supply amount (and the exhaust amount) of the inert gas is maintained at a relatively high value $\alpha$ from the point t1 to the point t3 in time. Thereafter, the supply amount (and the exhaust amount) of the inert gas is maintained at 0 from the point t3 to the point t4 in time. With such a replacement method, the inert gas is supplied into the processing space 20S at a high flow rate at all times during the period in which the lower opening 22 of the peripheral wall member 20 is closed by the lower lid member 30. Thus, the oxygen concentration in the processing space 20S is easily maintained low. Further, in this case, ozone generated by exposure from the point t2 to the point t3 in time is easily exhausted from the processing space 20S. Further, with this replacement method, it is not necessary to switch the supply amount (and the exhaust amount) of the inert gas to a plurality of values. Therefore, the configuration of the gas supply system 51 and the gas exhaust system 52 can be simplified.

Figure 14:
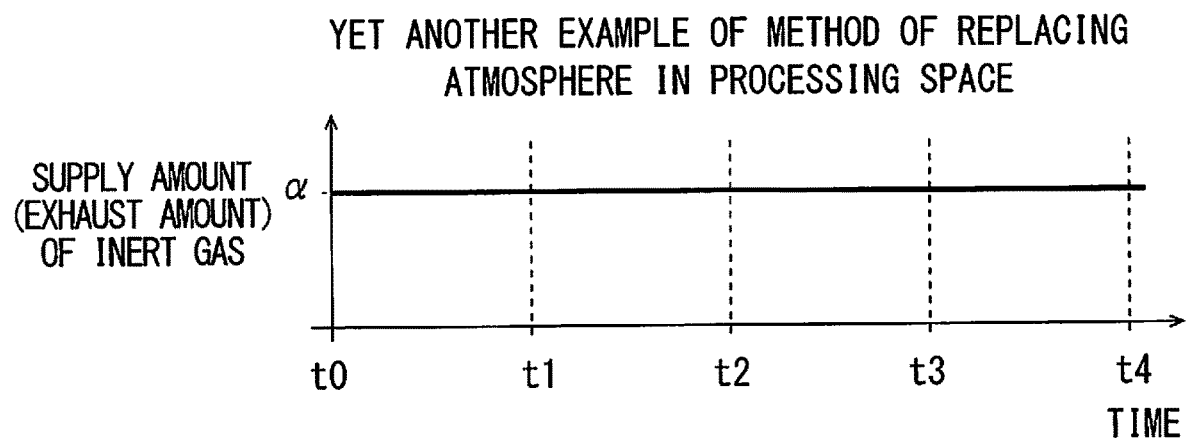
FIG. 14 is a diagram for explaining yet another example of the method of replacing the atmosphere in the processing space.

FIG. 14 is a diagram for explaining yet another example of the method of replacing the atmosphere in the processing space 20S. In FIG. 14, similarly to the example of FIG. 12, the temporal change of the amount of the inert gas to be supplied to the processing space 20S when exposure processing is performed is shown in a graph. In regard to the time axis of FIG. 14, the points t0, t1, t2, t3 and t4 in time are the same as the points t0, t1, t2, t3 and t4 in time of FIG. 12.

In the example of FIG. 14, the supply amount (and the exhaust amount) of the inert gas is maintained at a relatively high value $\alpha$ from the point t0 to the point t4 in time. With such a replacement method, the inert gas is supplied into the processing space 20S even when the lower opening 22 of the peripheral wall member 20 is opened. Therefore, the oxygen concentration in the processing space 20S is maintained somewhat low at a point in time at which the lower opening 22 is closed by the lower lid member 30. Thus, after the lower opening 22 is closed by the lower lid member 30, the oxygen concentration in the processing space 20S can become close to the target oxygen concentration in a shorter period of time. Further, an amount of ozone to be generated can be further suppressed.

[5] Effects (1) Because the peripheral wall member 20 has a cylindrical shape corresponding to the shape of the substrate W in the above-mentioned exposure device 100, the volume of the processing space 20S can be reduced. Thus, the atmosphere in the processing space 20S can be quickly replaced with the inert gas. Therefore, the oxygen concentration in the processing space 20S can be lowered in a short period of time.

Further, a corner portion in which gas stays is not present in the processing space 20S formed by the cylindrical peripheral wall member 20. Thus, when the atmosphere in the processing space 20S is replaced with the inert gas, a smooth flow of gas is formed along the inner peripheral surface of the peripheral wall member 20. This, particles are not likely to remain in the processing space 20S. Therefore, cleanliness of the substrate W in the processing space 20S can be improved.

Further, the lower lid member 30 opens and closes the lower opening 22 of the peripheral wall member 20, whereby the substrate W can be carried into and out from the processing space 20S. The lower opening 22 can be opened and closed with a simple configuration and a simple operation by movement of the lower lid member 30 in the up-and-down direction. Therefore, it is not necessary to provide an inlet-outlet port for the substrate W in the peripheral wall member 20 or provide a complicated structure for opening and closing the inlet-outlet port.

As a result, it is possible to improve efficiency of exposure processing with a simple and compact configuration without reducing the cleanliness of the substrate W.

(2) As described above, the first gas flow path 25 and the second gas flow path 26 are formed inside of the peripheral wall member 20. The inert gas is directly supplied into the processing space 20S through the first gas flow path 25. Further, the atmosphere in the processing space 20S is directly exhausted through the second gas flow path 26.

With such a configuration, it is not necessary to provide a member such as a pipe or a nozzle for supplying the inert gas into the processing space 20S. Further, it is not necessary to provide a member such as a pipe or a nozzle for exhausting the atmosphere inside to the outside of the processing space 20S in the processing space 20S. Thus, a region that interferes with a flow of gas in the processing space 20S is reduced, so that particles are unlikely to remain in the processing space 20S.

(3) In the peripheral wall member 20, the first gas flow path 25 and the second gas flow path 26 are opposite to each other with the processing space 20S located therebetween. In this case, a smooth flow of gas is formed from the first gas flow path 25 toward the second gas flow path 26. Thus, because the atmosphere in the processing space 20S can be smoothly replaced with the inert gas, the period of time required for replacement of the atmosphere is shortened. Further, because an occurrence of turbulence in the processing space 20S is suppressed, the oxygen concentrations in a plurality of parts in the processing space 20S can be kept uniform. Thus, the substrate W can be exposed uniformly.

(4) In the above-mentioned exposure device 100, the substrate W to be processed is supported by the plurality of support members 38 while being stored in the processing space 20S. Here, because the plurality of support members 38 are commonly attached to the flat upper surface 31 of the lower lid member 30, the positions of the plurality of support members 38 in the up-and-down direction can be easily and accurately adjusted when the plurality of support members 38 are attached to the lower lid member 30. Thus, the substrate W supported by the plurality of support members 38 is prevented from being inclined with respect to the emission surface 13S of the light emitter 10, and the substrate W can be uniformly exposed.

(5) In the above-mentioned exposure device 100, the lower lid member 30 moves in the up-and-down direction, whereby carrying-in of the substrate w to the processing space 20S and carrying-out of the substrate W from the processing space 20S are realized with a simple configuration and a simple operation.

[6] Substrate Processing Apparatus Including Exposure Device 100 of FIG. 1

Figure 15:
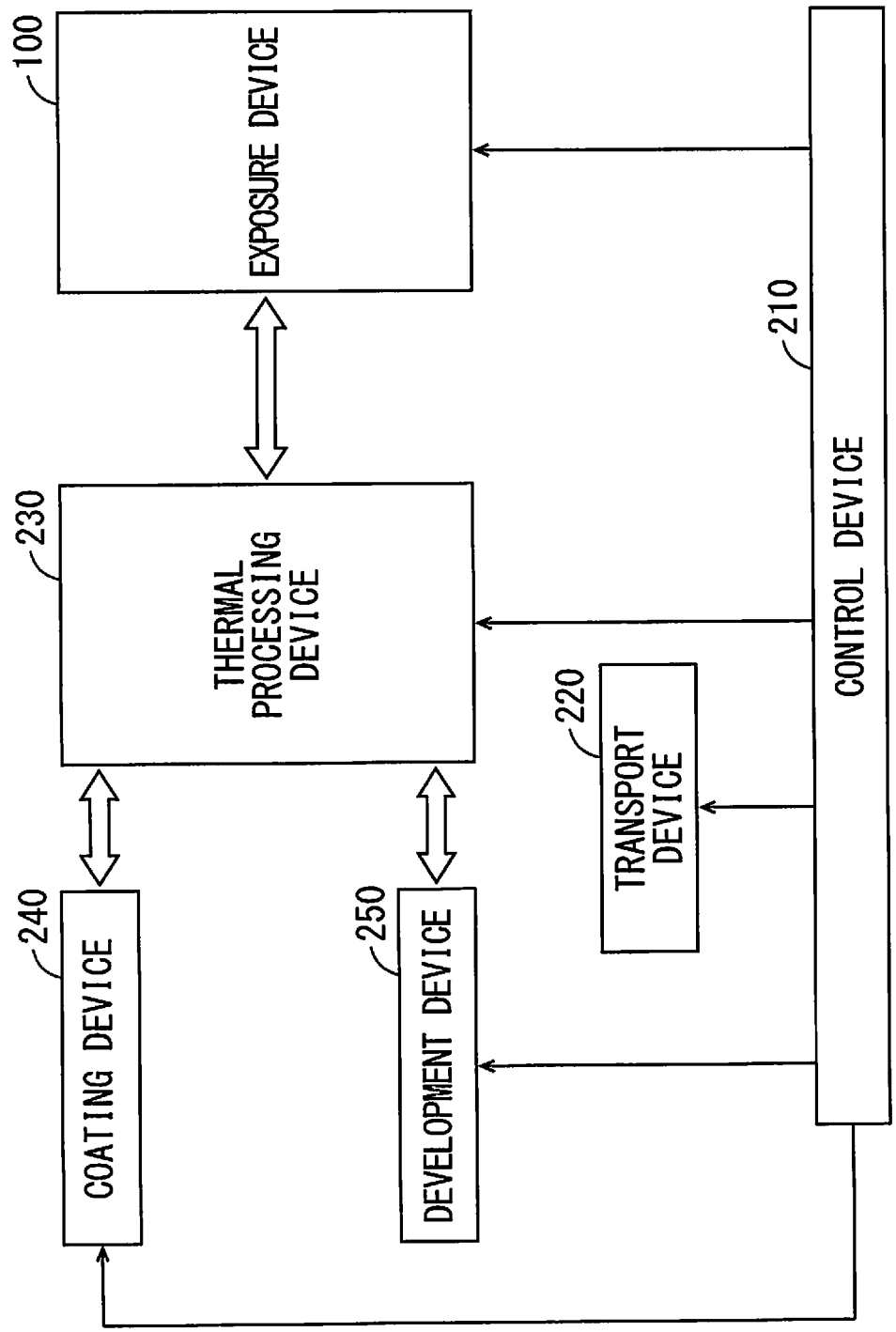
FIG. 15 is a schematic block diagram showing one example of a substrate processing apparatus including the exposure device of FIG. 1.

FIG. 15 is a schematic block diagram showing one example of a substrate processing apparatus including the exposure device 100 of FIG. 1. As shown in FIG. 15, the substrate processing apparatus 200 includes the control device 210, the transport device 220, a thermal processing device 230, a coating device 240 and a development device 250 in addition to the exposure device 100.

The control device 210 includes a CPU and a memory, or a microcomputer, for example, and controls the operations of the exposure device 100, the transport device 220, the thermal processing device 230, the coating device 240 and the development device 250.

The transport device 220 transports the substrate W among the exposure device 100, the thermal processing device 230, the coating device 240 and the development device 250 when the substrate W is processed by the substrate processing apparatus 200.

The thermal processing device 230 performs the thermal processing on the substrate W before the coating processing by the coating device 240, after the coating processing by the coating device 240, before the development processing by the development device 250 and after the development processing by the development device 250. The coating device 240 forms a film to be reformed by vacuum ultraviolet rays on the upper surface of the substrate W by applying a predetermined processing liquid to the upper surface of the substrate W. Specifically, the coating device 240 of the present example applies a processing liquid including a Directed Self Assembly material to the upper surface of the substrate W. In this case, patterns of two types of polymers are formed on the upper surface of the substrate W by microphase separation that occurs in the Directed Self Assembly material.

The exposure device 100 irradiates the upper surface of the substrate W on which the film is formed by the coating device 240 with vacuum ultraviolet rays. Thus, the coupling between the patterns of the two types of polymers formed on the substrate W is broken.

The development device 250 supplies a solvent for removing one polymer out of the patterns of the two types of polymers after exposure to the substrate W as a development liquid. Thus, a pattern made of another polymer remains on the substrate W.

The coating device 240 may apply a predetermined processing liquid to the upper surface of the substrate W such that an SOC (Spin-On-Carbon) film is formed instead of a film including Directed Self Assembly material as a film to be reformed by vacuum ultraviolet rays. In this case, it is possible to reform the SOC film by exposing the substrate W on which the SOC film is formed with use of vacuum ultraviolet rays.

In a case where the SOC film is formed in the coating device 240, a resist film may further be formed on the SOC film in the coating device 240 after the exposure processing. In this case, the substrate W on which the resist film is formed is exposed by the exposure device provided outside of the substrate processing apparatus 200, and then the development device 250 may perform development processing on the exposed substrate W.

With the above-mentioned exposure device 100, it is possible to improve efficiency of the exposure processing with a simple and compact configuration without reducing the cleanliness of the substrate W. Therefore, with the substrate processing apparatus 200 of FIG. 15, accuracy of processing of the substrate W is improved, and the manufacturing cost of the substrate W can be reduced.

[7] Other Embodiments (1) In the exposure device 100 according to the above-mentioned first embodiment, the inert gas supplied to the first gas flow path 25 is directly supplied into the processing space 20S, and the atmosphere in the processing space 20S is directly exhausted from the second gas flow path 26. Therefore, while a member to be used for supplying or exhausting gas such as a nozzle is not present in the processing space 20S, the present invention is not limited to this. In the processing space 20S, a member for controlling a flow of gas generated in the processing space 20S may be provided.

(2) In the exposure device 100 according to the above-mentioned first embodiment, the first gas flow path 25 and the second gas flow path 26 may be formed in the lower lid member 30 instead of being formed in the peripheral wall member 20.

(3) While the exposure processing is performed with the substrate W stored in the processing space 20S being supported by the plurality of support members 38 attached to the lower lid member 30 in the exposure device 100 according to the above-mentioned first embodiment, the present invention is not limited to this.

Figure 16:
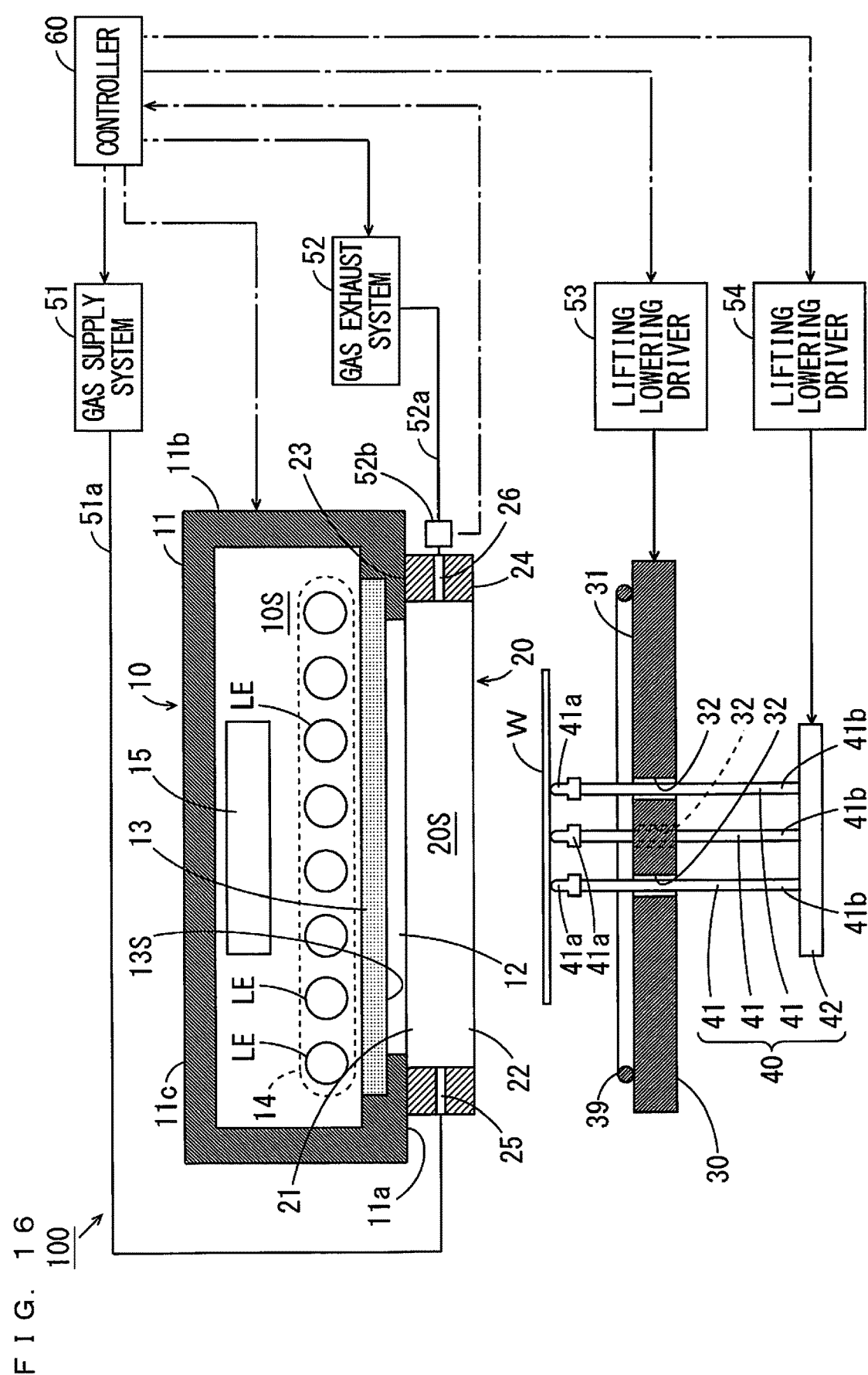
FIG. 16 is a schematic cross sectional view showing the configuration of an exposure device according to another embodiment.

The substrate supporting mechanism 40 may be provided to be movable in the up-and-down direction instead of the plurality of support members 38 being attached to the lower lid member 30. FIG. 16 is a schematic cross sectional view showing the configuration of an exposure device 100 according to another embodiment. The difference of the exposure device 100 of FIG. 16 from the exposure device 100 of FIG. 1 will be described.

In the exposure device 100 of FIG. 16, the plurality of support members 38 (FIG. 1) and the plurality of storage pipes 33 (FIG. 1) are not attached to the lower lid member 30. Meanwhile, a substrate supporting mechanism 40 is provided to be movable in the up-and-down direction with respect to a base portion of the exposure device 100 with a plurality of support pins 41 respectively inserted into a plurality of through holes 32 of the lower lid member 30. Further, the exposure device 100 of FIG. 16 further includes a lifting lowering driver 54 for moving the substrate supporting mechanism 40 in the up-and-down direction.

Here, the position of the substrate supporting mechanism 40 in the up-and-down direction when the upper ends of the plurality of support pins 41 are located in a processing space 20S are referred to as a processing position, and a position farther downward than the processing position by a certain distance is referred to as a waiting position.

The lifting lowering driver 54 includes a stepping motor, for example, and is configured to be capable of moving the substrate supporting mechanism 40 in the up-and-direction between the processing position and the waiting position. With such a configuration, in the present example, the substrate W that is carried in from the outside of the exposure device 100 is received by a plurality of tip members 41a of the substrate supporting mechanism 40 with the lower lid member 30 in a lid opening position pa1 and the substrate supporting mechanism 40 in the waiting position.

The substrate W that is carried in from the exposure device 100 is received by the substrate supporting mechanism 40, the lower lid member 30 moves to a lid closing position pa2, and the substrate supporting mechanism 40 moves to the processing position. Thus, the substrate W is stored in the processing space 20S. The substrate W supported by the plurality of tip members 41a is irradiated with vacuum ultraviolet rays.

When exposure of the substrate W ends, the lower lid member 30 moves to the lid opening position pa1, and the substrate supporting mechanism 40 moves to the waiting position. Thus, the substrate W is taken out to a position below the processing space 20. Finally, the substrate W supported by the plurality of tip members 41a is carried out of the exposure device 100.

With the above-mentioned configuration, the plurality of tip members 41a and the lower lid member 30 are configured to be capable of closing the plurality of through holes 32 in a case where the lower lid member 30 and the substrate supporting mechanism 40 are respectively located at the lid closing position pa2 and the processing position. Thus, a hermetic state in the processing space 20S when exposure processing is performed is ensured.

In the exposure device 100 of FIG. 16, the distance between an emission surface 13S of a light emitter 10 and the substrate W may be adjusted in accordance with the type of the substrate W and details of a process as long as the hermetic state in the processing space 20S is ensured. In this case, it is possible to shorten an exposure time by sufficiently reducing the distance between the emission surface 13S of the light emitter 10 and the substrate W. Thus, efficiency of exposure processing can be improved.

While the lifting lowering drivers 53, 54 are individually provided as the configuration for driving the lower lid member 30 and the substrate supporting mechanism 40 in the example of FIG. 16, the present invention is not limited to this.

In the exposure device 100 of FIG. 16, one lifting lowering driver that is configured to be capable of driving both of the lower lid member 30 and the substrate supporting mechanism 40 may be provided instead of the lifting lowering drivers 53, 54.

The lifting lowering driver may include one motor, and a first cam and a second cam provided at a rotation shaft of the motor, for example. In this case, the first cam is configured to be capable of lifting and lowering the lower lid member 30 between the lid opening position pa1 and the lid closing position pa2 by a rotational force generated by the motor. Further, a second cam is configured to be capable of lifting and lowering the substrate supporting mechanism 40 between the waiting position and the processing position by a rotational force generated by the motor.

Alternatively, the lifting lowering driver may include one air cylinder and a bar-shape shaft member, for example. In this case, the lower lid member 30 and the substrate supporting mechanism 40 are attached to the shaft member. In this configuration, the air cylinder moves the other end of the shaft member in the up-and-down direction with one end of the shaft member fixed, for example. Thus, the lower lid member 30 is lifted and lowered between the lid opening position pa1 and the lid closing position pa2, and the substrate supporting mechanism 40 is lifted and lowered between the waiting position and the processing position.

With the above-mentioned configuration, the number of components of the exposure device 100 is reduced, and the exposure device 100 can be made compact.

(4) While the tip members 41a are provided in the substrate supporting mechanism 40 to seal the processing space 20S in the exposure device 100 according to the above-mentioned first embodiment, the present invention is not limited to this. For example, in a case where a significantly high hermetic state is not required in regard to the processing space 20S, the tip members 41a do not have to be provided in the substrate supporting mechanism 40.

(5) While the supply amount and the exhaust amount of the inert gas with respect to the processing space 20S during exposure processing are equal to each other in the above-mentioned first embodiment, the present invention is not limited to this. The supply amount and the exhaust amount of the inert gas with respect to the processing space 20S during exposure processing may be different from each other. For example, the exhaust amount of the atmosphere in the processing space 20S may be smaller than the supply amount of the inert gas, and the exhaust amount of the atmosphere in the processing space 20S may be larger than the supply amount of the inert gas.

(6) While determination whether the oxygen concentration in the processing space 20S has lowered to the target oxygen concentration during exposure processing is made based on the output of the oxygen concentration meter 52b in the exposure device 100 according to the above-mentioned first embodiment, the present invention is not limited to this.

For example, in a case where the period of time required for the oxygen concentration in the processing space 20S to reach the target oxygen concentration (hereinafter referred to as a concentration reach time) from a point in time at which the lower opening 22 is closed is known, the above-mentioned determination may be made based on the concentration reach time. In this case, the oxygen concentration meter 52*b* is not required, and the configuration of the exposure device 100 is simplified.

[8] Correspondences Between Constituent Elements in Claims and Parts in Preferred Embodiments In the following paragraphs, non-limiting examples of correspondences between various elements recited in the claims below and those described above with respect to various preferred embodiments of the present invention are explained. In the above-mentioned first embodiment, the lower lid member 30 is an example of a closing member, the support member 38 is an example of a substrate supporter, the gas supply system 51 is an example of a supplier, the gas exhaust system 52 is an example of an exhauster, the period of time from the point t1 to the point t2 in time in FIGS. 12 to 14 is an example of a first time, the value α of FIGS. 12 to 14 is an example of a first flow rate, the period of time from the point t2 to the point t3 in time in FIGS. 12 to 14 is an example of a second time, and the value β of FIGS. 12 to 14 is an example of a second flow rate.

As each of constituent elements recited in the claims, various other elements having configurations or functions described in the claims can be also used.

[B] Second Embodiment

[1] Configuration of Exposure Device

Figure 17:
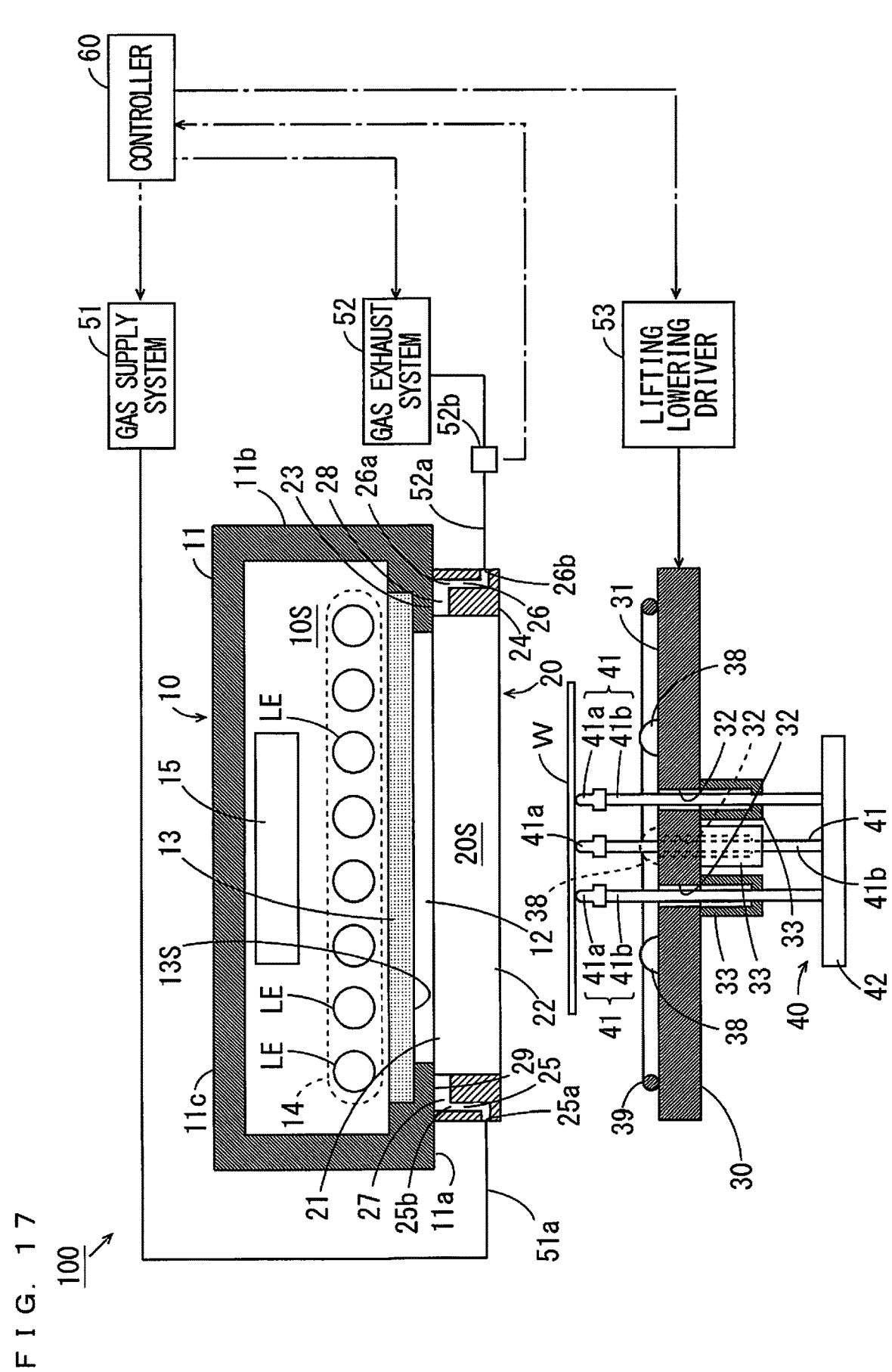
FIG. 17 is a schematic cross sectional view showing the configuration of an exposure device according to a second embodiment of the present invention.
Figure 18:
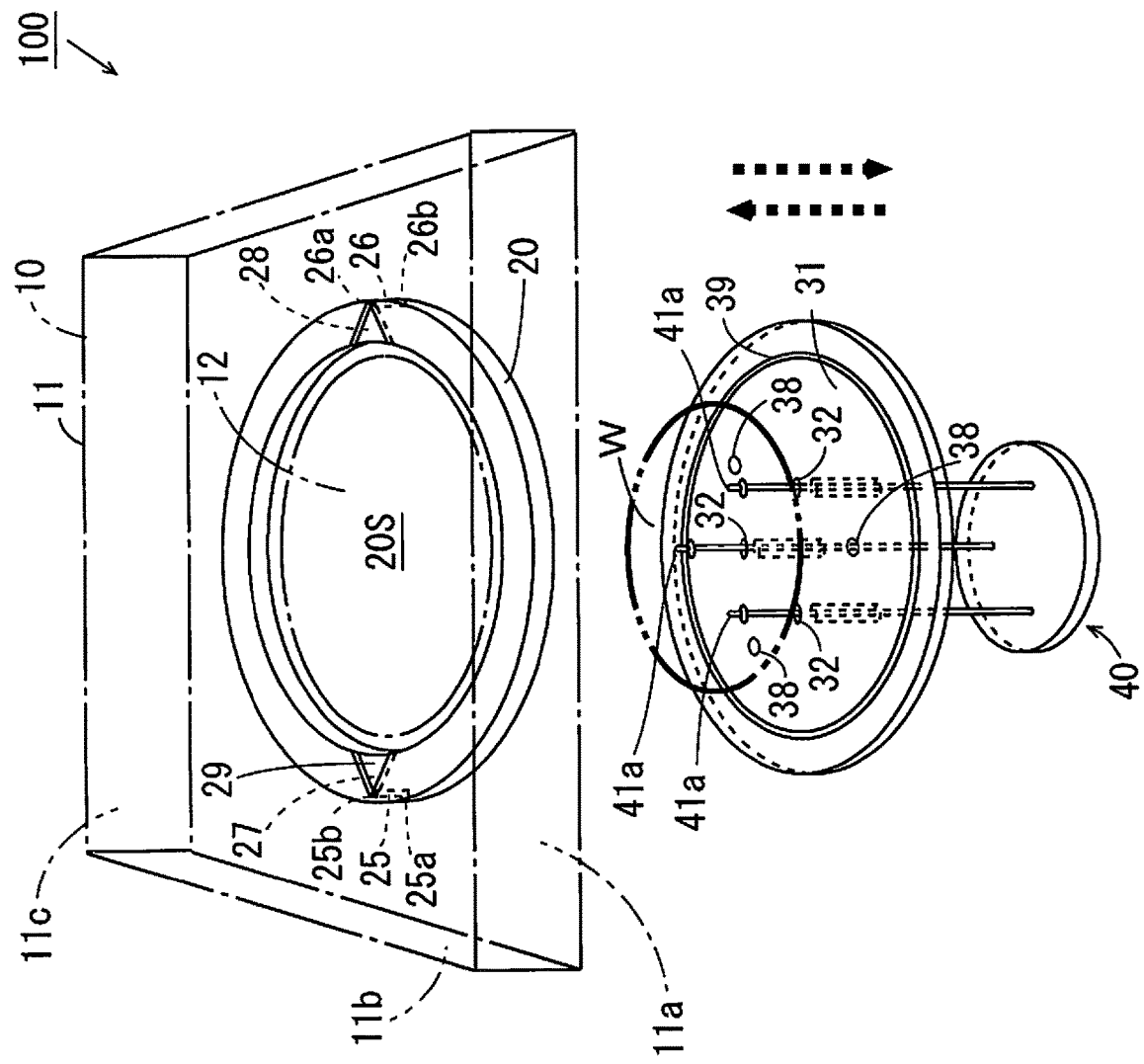
FIG. 18 is a perspective view for explaining an operation of part of the constituent elements of the exposure device of FIG. 17.

FIG. 17 is a schematic cross sectional view showing the configuration of an exposure device according to a second embodiment of the present invention, and FIG. 18 is a perspective view for explaining the operation of part of the constituent elements of the exposure device 100 of FIG. 17. The configuration and operation of the exposure device 100 of FIGS. 17 and 18 are similar to those of the exposure device 100 of FIGS. 1 and 2 except for the configuration of a peripheral wall member 20.

[2] Configuration of Peripheral Wall Member 20

Figure 19:
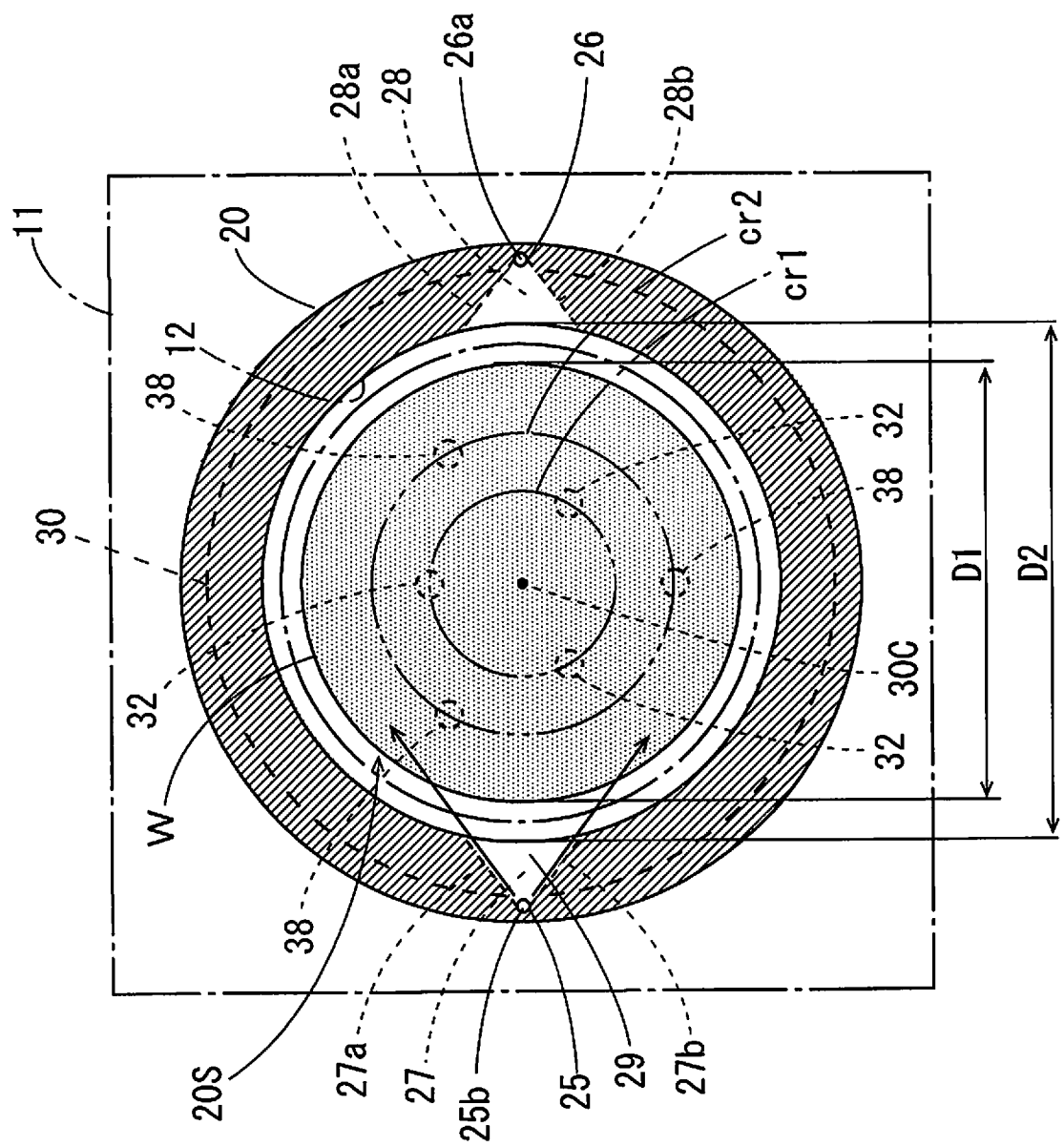
FIG. 19 is a schematic plan view of a peripheral wall member of FIG. 17.
Figure 20:
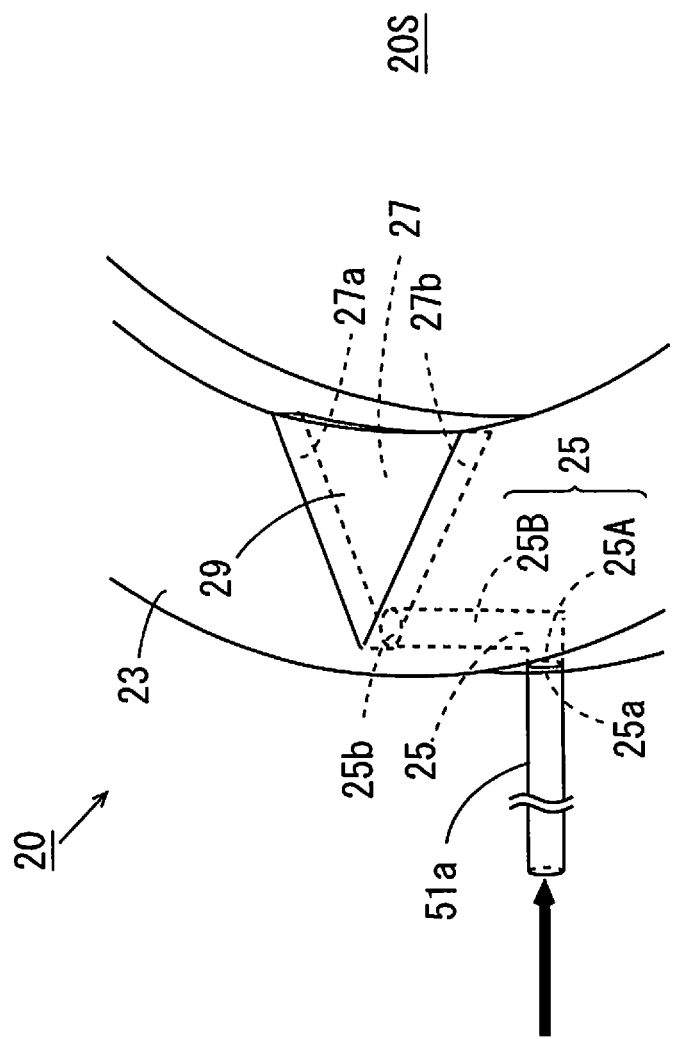
FIG. 20 is an enlarged perspective view showing the configuration of a first gas flow path of FIG. 19.

FIG. 19 is a schematic plan view of the peripheral wall member 20 of FIG. 17. FIG. 20 is an enlarged perspective view showing the configuration of a first gas flow path 25 of FIG. 19. The peripheral wall member 20 of FIGS. 17, 18 and 19 are different from the peripheral wall member 20 of FIGS. 1, 2 and 3 in the following points.

As shown in FIGS. 17, 18 and 19, the first gas flow path 25 and a second gas flow path 26 are formed inside of the peripheral wall member 20. As shown in FIG. 20, the first gas flow path 25 includes an upstream flow path portion 25A and a downstream flow path portion 25B, and has an L-shape cross section.

Specifically, the upstream flow path portion 25A extends horizontally and inwardly from a lower portion of an outer surface of the peripheral wall member 20. The downstream flow path portion 25B extends vertically and upwardly from the inner end of the upstream flow path portion 25A to an upper end surface 23 of the peripheral wall member 20. The outer end of the upstream flow path portion 25A is an upstream end portion 25*a* of the first gas flow path 25. The upper end of the downstream flow path portion 25B is a downstream end portion 25*b* of the first gas flow path 25.

A pipe 51*a* is connected to the upstream end portion 25*a* of the first gas flow path 25. In this case, an inert gas supplied from the pipe 51*a* to the upstream end portion 25*a* of the first gas flow path 25 is guided horizontally and inwardly in the upstream flow path portion 25A. Thereafter, the inert gas is supplied upwardly in the downstream flow path portion 25B and ejected upwardly from the downstream end portion 25*b* of the first gas flow path 25.

A bottomed first opening 27 that causes the first gas flow path 25 and the processing space 20S to communicate with each other is formed in the upper end surface 23 of the peripheral wall member 20. Specifically, the first opening 27 has a first side surface 27*a* and a second side surface 27*b* facing each other with the space above the downstream end portion 25*b* of the first gas flow path 25 located therebetween. The distance between the first side surface 27*a* and the second side surface 27*b* gradually becomes larger from the downstream end portion 25*b* of the first gas flow path 25 to the processing space 20S. While the first and second side surfaces 27*a*, 27*b* are formed to be planer in the present example, the present embodiment is not limited to this. The first and second side surfaces 27*a*, 27*b* may be formed to curved, for example.

A collision surface 29 with which an ejected inert gas collides is provided at the first opening 27 and above the downstream end portion 25*b* of the first gas flow path 25. The collision surface 29 is located at a position farther upward than the upper surface of the substrate W supported by a plurality of support members 38 when the substrate W is exposed. In the present example, a bottom wall portion 11*a* of the housing 11 of the light emitter 10 of FIG. 17 is used as the collision surface 29.

The inert gas ejected from the downstream end portion 25*b* of the first gas flow path 25 collides with the collision surface 29, and is guided by the first and second side surfaces 27*a*, 27*b* of the first opening 27 to be supplied to the processing space 20S. In this case, as indicated by the arrows in FIG. 19, the inert gas is diffused in the processing space 20S to spread in a horizontal plane. Thus, the inert gas can be uniformly supplied to the space between the light emitter 10 and the substrate W in the processing space 20S in a short period of time.

Figure 21:
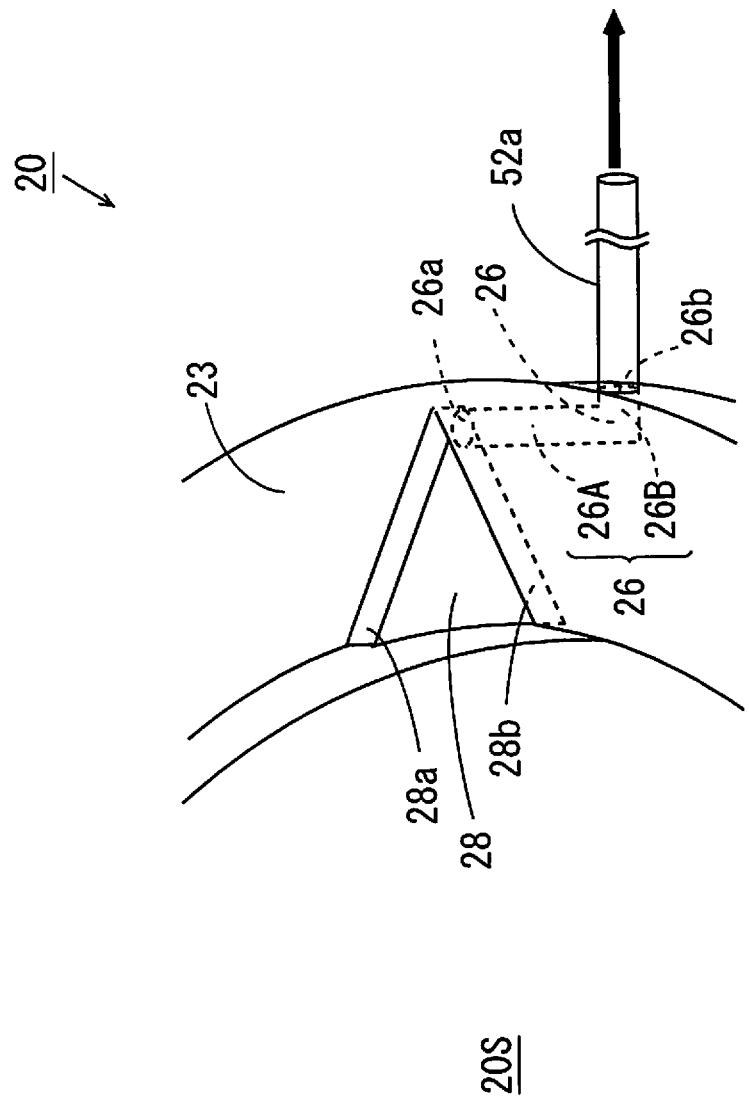
FIG. 21 is an enlarged perspective view showing the configuration of a second gas flow path of FIG. 19.

FIG. 21 is an enlarged perspective view showing the configuration of the second gas flow path 26 of FIG. 19. As shown in FIG. 21, a bottomed second opening 28 that causes the second gas flow path 26 and the processing space 20S to communicate with each other is formed in the upper end surface 23 of the peripheral wall member 20. In the present example, the first opening 27 and the second opening 28 are opposite to each other with the processing space 20S located therebetween (see FIG. 19).

The second opening 28 has a third side surface 28*a* and a fourth side surface 28*b* facing each other with the space above the upstream end portion 26*a* of the second gas flow path 26 located therebetween. The closer a position is to the downstream end portion 25*b* of the second gas flow path 26, the smaller the distance between the third side surface 28*a* and the fourth side surface 28*b* gradually becomes, the position being located between the processing space 20S and the downstream end portion 25*b* of the second gas flow path 26. While the third and fourth side surfaces 28*a*, 28*b* are formed to be planar in the present example, the embodiment is not limited to this. The third and fourth side surfaces 28*a*, 28*b* may be formed to be curved, for example.

Further, a bottom wall portion 11a of the housing 11 of the light emitter 10 of FIG. 17 is located above the upstream end portion 26a of the second gas flow path 26. The gas exhaust system 52 of FIG. 17 operates, whereby the atmosphere in the processing space 20S is guided from the upstream end portion 26a into the second gas flow path 26 along the bottom wall portion 11a of the housing 11 and the third and fourth side surfaces 28a, 28b of the second opening 28.

The second gas flow path 26 includes an upstream flow path portion 26A and a downstream flow path portion 26B and has an L-shape cross section. Specifically, the upstream flow path portion 26A extends vertically and downwardly from the upper end surface 23 of the peripheral wall member 20. The downstream flow path portion 26B extends horizontally from the lower end of the upstream flow path portion 26A to the outer surface of the peripheral wall member 20. The upper end of the upstream flow path portion 26A is an upstream end portion 26a of the second gas flow path 26. The outer end of the downstream flow path portion 26B is a downstream end portion 26b of the second gas flow path 26.

A pipe 52a is connected to the downstream end portion 26b of the second gas flow path 26. In this case, the inert gas flowing from the second opening 28 is guided downwardly in the upstream flow path portion 26A from the upstream end portion 26a in an upper portion. Thereafter, the inert gas is guided horizontally and outwardly in the downstream flow path portion 26B and is exhausted to the pipe 52a. Thus, a flow of inert gas can be formed more easily in the processing space 20S. Therefore, a period of time required for uniform replacement of the atmosphere on the substrate W in the processing space 20S can be shortened.

The heights of the first side surface 27a and the second side surface 27b of FIG. 20 and the third side surface 28a and the fourth side surface 28b of FIG. 21 are larger than 1 mm and not more than 10 mm, for example, and is preferably larger than 1 mm and not more than 5 mm. The heights of the first side surface 27a, the second side surface 27b, the third side surface 28a and the fourth side surface 28b of the peripheral wall member 20 of the present example are 2 mm.

[3] Basic Operation of Exposure Device 100 when Exposure Processing is Performed In the exposure device 100 according to the second embodiment, the substrate W is irradiated with vacuum ultraviolet rays in the processing space 20S in which the oxygen concentration above the substrate W is maintained low. The basic operation of the exposure device 100 when the exposure processing is performed will be described below.

Figure 22:
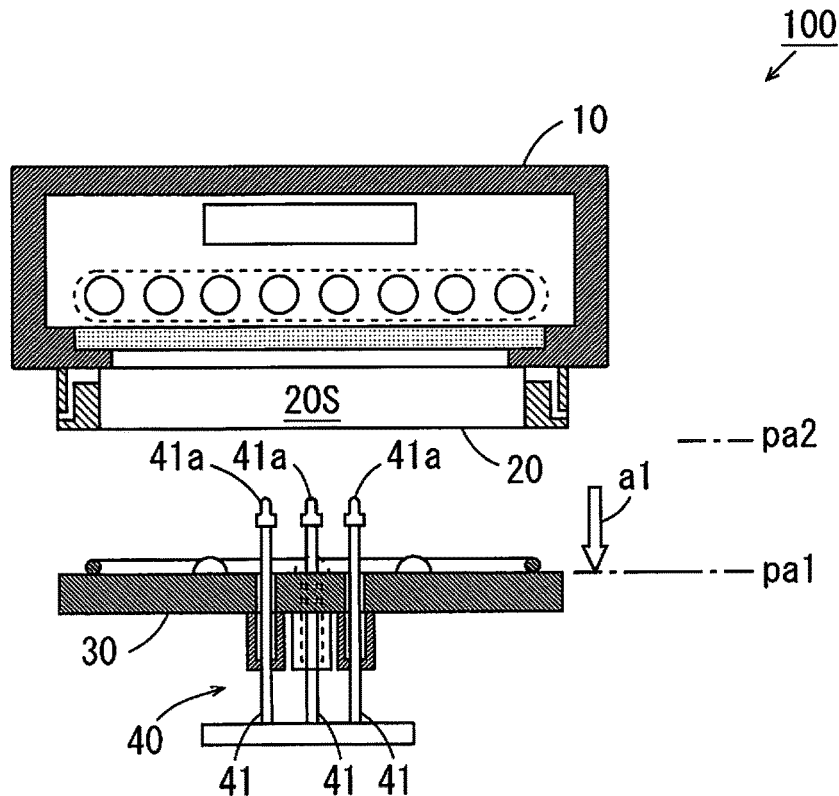
FIG. 22 is a schematic side view for explaining the basic operation of the exposure device according to the second embodiment when the exposure processing is performed.
Figure 23:
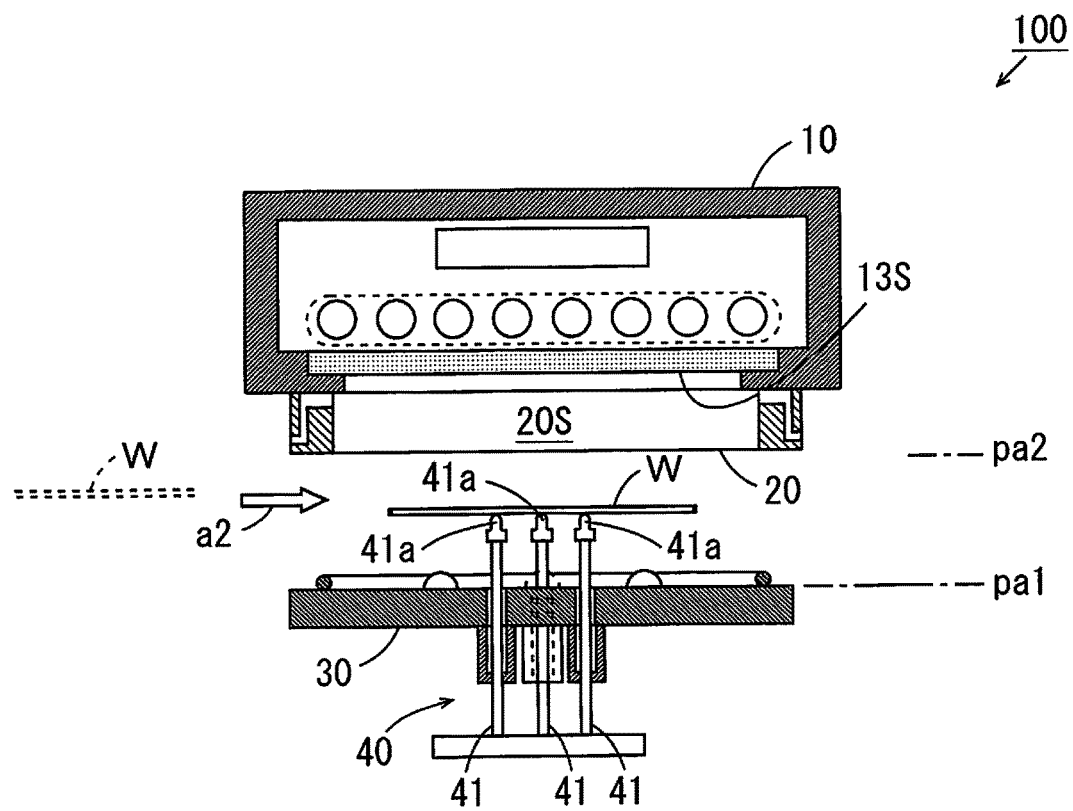
FIG. 23 is a schematic side view for explaining the basic operation of the exposure device according to the second embodiment when the exposure processing is performed.
Figure 24:
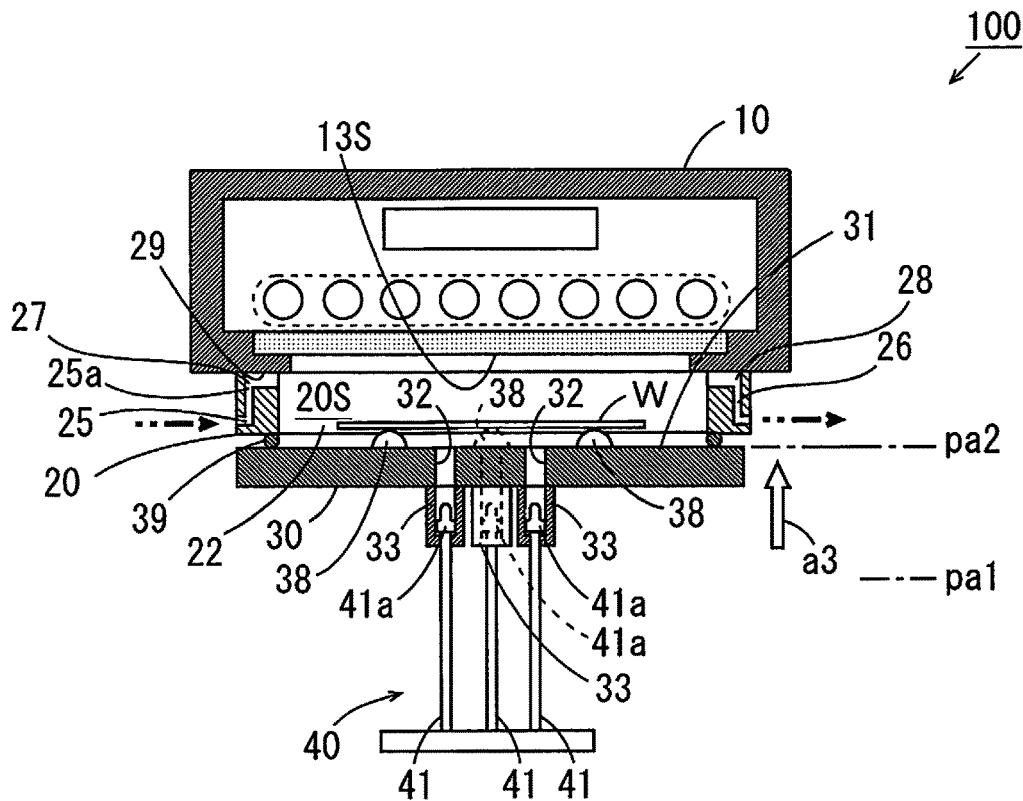
FIG. 24 is a schematic side view for explaining the basic operation of the exposure device according to the second embodiment when the exposure processing is performed.

FIGS. 22 to 27 are schematic side views for explaining the basic operation of the exposure device 100 according to the second embodiment when the exposure processing is performed. First, the operations of the exposure device 100 shown in FIGS. 22 to 24 are performed. The operations shown in FIGS. 22 to 24 are similar to the operations shown in FIGS. 4 to 6 except for the following points.

As shown in FIG. 24, as indicated by the one-dot and dash arrows, an inert gas is supplied to the first opening 27 through the first gas flow path 25 from the gas supply system 51 of FIG. 17 with the processing space 20S sealed. Then, the inert gas ejected from the downstream end portion 25b of the first gas flow path 25 collides with the collision surface 29. The direction in which the inert gas flows is changed by the collision with the collision surface 29 from the vertical direction to the horizontal direction. Thereafter, the inert gas is supplied into the processing space 20S along the first side surface 27a and the second side surface 27b of the first opening 27, and the collision surface 29 of FIG. 19.

Further, the atmosphere in the processing space 20S is exhausted to the outside of the exposure device 100 by the gas exhaust system 52 of FIG. 17 through the second opening 28 and the second gas flow path 26. Thus, the atmosphere in the processing space 20S is gradually replaced with the inert gas, and the oxygen concentration in the processing space 20S is lowered.

Figure 25:
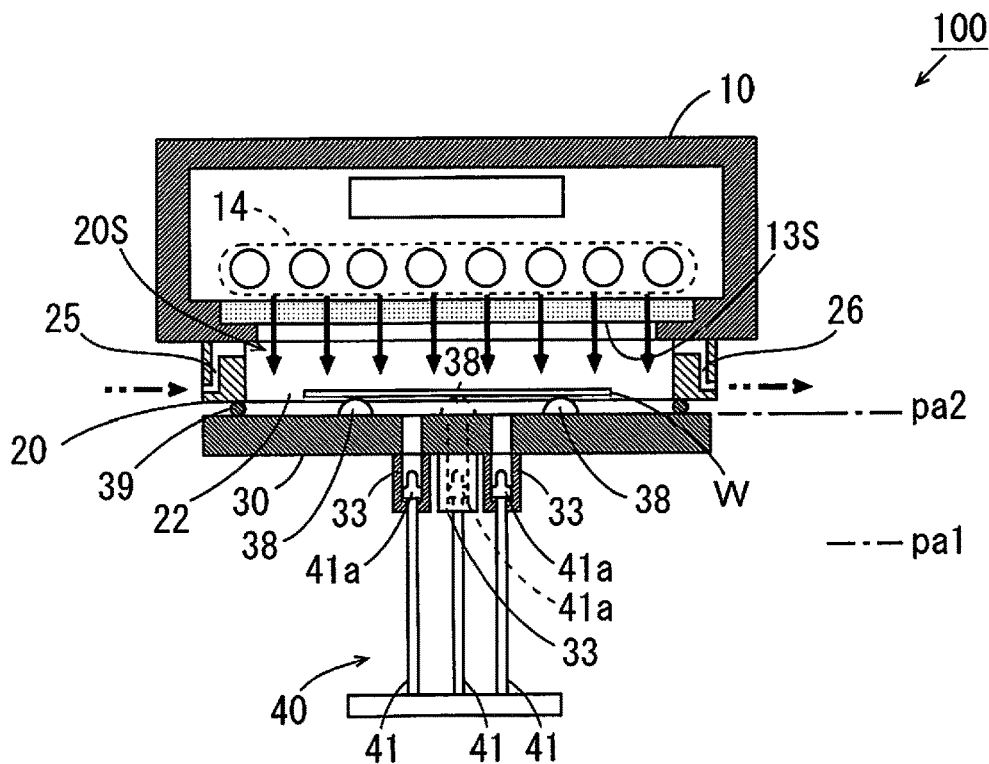
FIG. 25 is a schematic side view for explaining the basic operation of the exposure device according to the second embodiment when the exposure processing is performed.
Figure 26:
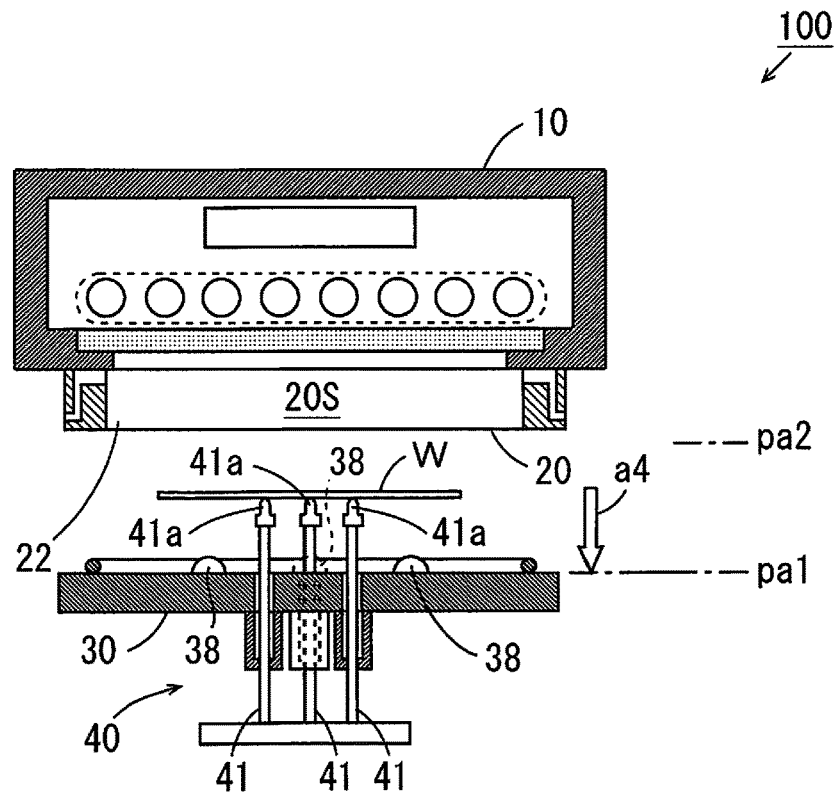
FIG. 26 is a schematic side view for explaining the basic operation of the exposure device according to the second embodiment when the exposure processing is performed.
Figure 27:
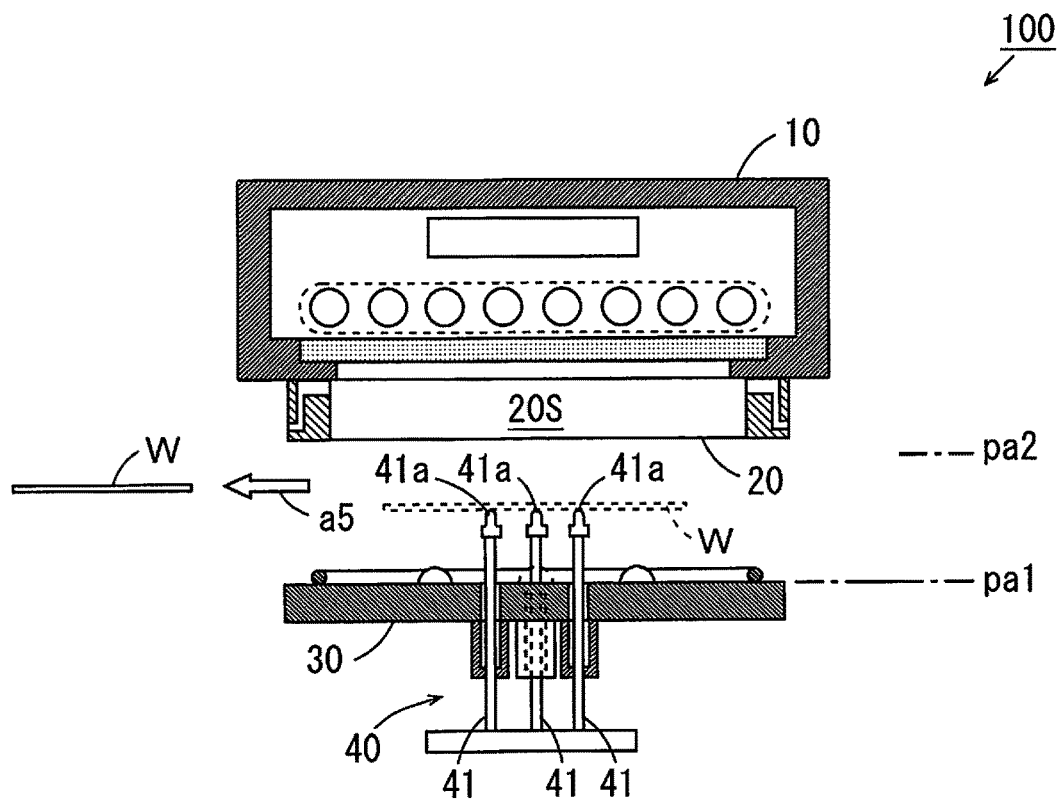
FIG. 27 is a schematic side view for explaining the basic operation of the exposure device according to the second embodiment when the exposure processing is performed.

Thereafter, the operations shown in FIGS. 25 to 27 are performed. The operations shown in FIGS. 25 to 27 are similar to the operations shown in FIGS. 7 to 9.

[4] Series of Processes Performed by Controller 60 when Exposure Processing is Performed A series of processes performed by the controller 60 of the exposure device 100 according to the second embodiment shown in FIG. 17 is similar to the series of processes shown in FIGS. 10 and 11.

[5] Inventive Examples and Comparative Examples

In inventive examples 1 and 2, uniform replacement of the atmosphere in the processing space 20S with a nitrogen gas was simulated using the peripheral wall member 20 of the above-mentioned second embodiment. In a comparative example 1, uniform replacement of the atmosphere in the processing space 20S with a nitrogen gas was simulated using the peripheral wall member 20A shown in FIG. 3. In the simulations, comparison was made in regard to the flow rate of the nitrogen gas, the supply time of the nitrogen gas and the oxygen concentration after replacement. The nitrogen gas is supplied and exhausted simultaneously, and the supply amount of the nitrogen gas and the exhaust amount of the atmosphere in the processing space 20S are equal to each other.

As shown in FIG. 3, the peripheral wall member 20 of the comparative example does not include the first opening 27 or the second opening 28. The thickness, the height and the inner diameter D2 of the peripheral wall member 20A are equal to the thickness, the height, the inner diameter D2 of the peripheral wall member 20 of each of the inventive examples 1 and 2, respectively.

FIG. 28 is a diagram showing the results of comparison among the inventive example 1, the inventive example 2 and the comparative example 1. As shown in FIG. 28, in the inventive example 1, when the flow rate of the nitrogen gas to be supplied was 10 L/min, the oxygen concentration in the processing space 20S became not more than 1% after 19 seconds elapsed. In the inventive example 2, when the flow rate of the nitrogen gas to be supplied was 13 L/min, the oxygen concentration in the processing space 20S became not more than 1% after 13 seconds elapsed. On the other hand, in the comparative example 1, when the flow rate of the nitrogen gas to be supplied was 9 L/min, the oxygen concentration in the processing space 20S became 6% after 20 seconds elapsed.

From the results of comparison among the inventive example 1, the inventive example 2 and the comparative example 1, it was confirmed that it was possible to sufficiently lower the oxygen concentration while shortening the period of time required for uniform replacement by using the peripheral wall member 20 of the above-mentioned second embodiment.

[6] Effects (1) In the exposure device 100 according to the above-mentioned second embodiment, the inert gas reaches the downstream end portion 25b through the first gas flow path 25 formed in the peripheral wall member 20. The inert gas supplied from the downstream end portion 25b to the first opening 27 collides with the collision surface 29 located at a position farther upward than the substrate W, and then flows along the first side surface 27a and the second side surface 27b into the processing space 20S. In this case, the atmosphere between the emission surface 13S and the substrate W can be replaced uniformly. Further, it is not necessary to replace the entire atmosphere in the processing space 20S. Therefore, the period of time required for replacement can be shortened. As a result, efficiency and accuracy of the exposure processing can be enhanced.

(2) In the exposure device 100 according to the above-mentioned second embodiment, the peripheral wall member 20 is cylindrical. In this case, a corner portion in which gas stays is not present in the processing space 20S formed by the cylindrical peripheral wall member 20. Therefore, when the atmosphere in the processing space 20S is replaced with the inert gas, a smooth flow of gas is formed along the inner peripheral surface of the peripheral wall member 20. Thus, the period of time required for replacement can be shortened, and the inert gas to be used for replacement can be suppressed.

(3) In the exposure device 100 according to the above-mentioned second embodiment, the peripheral wall member 20 has the second gas flow path 26 that exhausts the atmosphere in the processing space 20S. In this case, the atmosphere in the processing space 20S is exhausted by the gas exhaust system 52, whereby a flow of the inert gas can be formed easily in the processing space 20S. Therefore, the period of time required for uniform replacement of the atmosphere on the substrate W in the processing space 20S can be shortened.

(4) As described above, it is not necessary to provide the collision surface 29 separately by using the bottom wall portion 11a that is part of the lower surface of the light emitter 10 which closes the upper opening 21 of the peripheral wall member 20 as the collision surface 29. Therefore, the manufacturing cost for the exposure device can be suppressed.

(5) In the exposure device 100 according to the above-mentioned second embodiment, the lower lid member 30 moves to the lid opening position pa1 below the processing space 20S when the substrate W is carried into or carried out from the processing space 20S. Thus, the substrate W can be received and transferred easily between the outside of the exposure device 100 and the tip members 41a of the substrate supporting mechanism 40. Further, the lower lid member 30 moves to the lid closing position pa2 above the lid opening position pa1 when the substrate W is exposed. Thus, the lower opening 22 can be closed easily.

(6) In the exposure device 100 according to the above-mentioned second embodiment, the plurality of support members 38 are provided on the upper surface 31 of the lower lid member 30. In this case, the plurality of support members 38 move in the up-and-down direction together with the lower lid member 30. Thus, the substrate W can be placed on the plurality of support members 38 from the outside of the exposure device 100 below the processing space 20S. Further, when the substrate W is exposed, the plurality of support members 38 move upwardly. Thus, the substrate W becomes closer to the emission surface 13S. Thus, efficiency of the exposure processing of the substrate W can be more sufficiently improved.

[7] Substrate Processing Apparatus Including Exposure Device 100 of FIG. 17

The configuration and operation of the substrate processing apparatus 200 including the exposure device 100 of FIG. 17 are similar to the configuration and operation of the substrate processing apparatus 200 of FIG. 15 except that the exposure device 100 of FIG. 17 is used instead of the exposure device 100 of FIG. 1. In this case, with the exposure device 100 of the second embodiment, it is possible to improve efficiency of the exposure processing without reducing cleanliness of the substrate W with the simple and compact configuration. In this case, processing accuracy of the substrate W is improved, and the manufacturing cost of the substrate W can be reduced.

[8] Other Embodiments (1) While the second gas flow path 26 that exhausts the atmosphere in the processing space 20S is provided in the exposure device 100 according to the above-mentioned second embodiment, the present invention is not limited to this.

For example, a plurality of exhaust ports may be provided at positions opposite to the first gas flow path 25 and the downstream end portion 25b of the first flow path with the processing space 20S located therebetween. In this case, the atmosphere in the processing space 20S is exhausted from the plurality of exhaust ports, whereby a flow of the inert gas can be formed more easily in the processing space 20S. Therefore, the period of time required for uniform replacement of the atmosphere on the substrate W in the processing space 20S can be shortened.

(2) While the first gas flow path 25 and the second gas flow path 26 have the L-shape cross sections in the exposure device 100 according to the above-mentioned second embodiment, the present invention is not limited to this.

For example, the first gas flow path 25 and the second gas flow path 26 may be formed by a hole that penetrates the peripheral wall member 20 upwardly in the vertical direction.

(3) While the second opening 28 and the second gas flow path 26 are formed in the exposure device 100 according to the above-mentioned second embodiment, the present invention is not limited to this.

For example, the second opening 28 and the second gas flow path 26 may be formed by a through hole formed to extend from the outer peripheral surface to the inner peripheral surface of the peripheral wall member 20 similarly to the second gas flow path 26 shown in FIG. 3.

(4) While the bottom wall portion 11a that is part of the lower surface of the light emitter 10 that closes the upper opening 21 of the peripheral wall member 20 is used as the collision surface 29 in the exposure device 100 according to the above-mentioned second embodiment, the present invention is not limited to this.

For example, part of the peripheral wall member 20 may be formed at the upper surface of the first opening 27. Also in this case, a portion inside of the peripheral wall member 20 is used as the collision surface 29, so that it is not necessary to provide the collision surface 29 separately. Therefore, the manufacturing cost of the exposure device 100 can be suppressed.

(5) While determination whether the oxygen concentration in the processing space 20S is lowered to the target oxygen concentration during exposure processing is made based on the output of the oxygen concentration meter 52b in the exposure device 100 according to the above-mentioned second embodiment, the present invention is not limited to this.

For example, in a case where the period of time required for the oxygen concentration in the processing space 20S to reach the target oxygen concentration (hereinafter referred to as a concentration reach time) from a point in time at which the lower opening 22 is closed is known, the above-mentioned determination may be made based on the concentration reach time. In this case, the oxygen concentration meter 52*b* is not required, and the configuration of the exposure device 100 is simplified.

(6) While the exposure processing is performed with the substrate W stored in the processing space 20S supported by the plurality of support members 38 attached to the lower lid member 30 in the exposure device 100 according to the above-mentioned second embodiment, the present invention is not limited to this. The substrate supporting mechanism 40 may be provided to be movable in the up-and-down direction instead of the plurality of support members 38 being attached to the lower lid member 30. FIG. 29 is a schematic cross sectional view showing the configuration of the exposure device 100 according to another embodiment. The exposure device 100 of FIG. 29 is different from the exposure device 100 of FIG. 17 in that a plurality of storage pipes 33 and the support member 38 are not provided but the lifting lowering driver 54 is further provided. The configurations and operations of the lower lid member 30, the substrate supporting mechanism 40, the lifting lowering driver 53 and the lifting lowering driver 54 in FIG. 29 are similar to those of the lower lid member 30, the substrate supporting mechanism 40, the lifting lowering driver 53 and the lifting lowering driver 54 of FIG. 16.

(7) While the tip members 41*a* are provided at the substrate supporting mechanism 40 to seal the processing space 20S in the exposure device 100 according to the above-mentioned second embodiment, the present invention is not limited to this. For example, in a case where a significantly high hermetic state is not required in regard to the processing space 20S, the tip members 41*a* do not have to be provided in the substrate supporting mechanism 40.

[9] Correspondences Between Constituent Elements in Claims and Parts in Preferred Embodiments In the following paragraphs, non-limiting examples of correspondences between various elements recited in the claims below and those described above with respect to various preferred embodiments of the present invention are explained. In the above-mentioned second embodiment, the support member 38 is an example of a substrate supporter, the first gas flow path 25 is an example of a flow path, the gas exhaust system 52 is an example of a gas exhauster, the bottom wall portion 11*a* of the light emitter 10 is an example of part of a lower surface of a light emitter, the lower lid member 30 is an example of a closing member, the lid opening position pa1 is an example of a first position and the lid closing position pa2 is an example of a second position.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. An exposure device that performs exposure processing on a substrate, comprising:
   a peripheral wall member that forms a processing space in which the substrate is storable and has an upper opening;
   a light emitter that closes the upper opening and has an emission surface that is emittable of vacuum ultraviolet rays; and
   a substrate supporter that supports the substrate in the processing space below the light emitter when exposure is carried out by the light emitter, wherein
   the peripheral wall member has a flow path that guides an inert gas from below to above and an opening that causes the flow path and the processing space to communicate with each other,
   the opening has a first side surface and a second side surface that face each other,
   a distance between the first side surface and the second side surface gradually becomes larger from a downstream end portion of the flow path to the processing space, and
   a collision surface with which the inert gas that flows out to the opening from the downstream end portion of the flow path collides is provided, and the collision surface is located at a position farther upward than the substrate supported by the substrate supporter when exposure is carried out.

2. The exposure device according to claim 1, wherein the peripheral wall member is cylindrical.

3. The exposure device according to claim 1, wherein the peripheral wall member includes an exhauster that exhausts an atmosphere in the processing space.

4. The exposure device according to claim 1, wherein the collision surface is constituted by part of a lower surface of the light emitter.

5. The exposure device according to claim 1, wherein the collision surface is provided in the peripheral wall member.

6. The exposure device according to claim 1, wherein a lower opening is formed in the peripheral wall member, and
   the exposure device further includes
   a closing member that is configured to be capable of closing and opening the lower opening, and
   a lifting lowering driver that controls the closing member such that the closing member moves to a first position below the lower opening when the substrate is received or transferred between outside and the substrate supporter and the closing member moves to a second position at which the closing member closes the lower opening when the substrate is exposed.

7. The exposure device according to claim 6, wherein the substrate supporter is provided at an upper surface of the closing member.

8. An exposure device that performs exposure processing on a substrate that is at least partially circular, comprising:
   a cylindrical peripheral wall member that forms a processing space in which the substrate is storable and has an upper opening and a lower opening;
   a light emitter that has an emission surface that is provided above the peripheral wall member to close the upper opening of the peripheral wall member and emittable of vacuum ultraviolet rays to the processing space;
   a closing member that is provided to be movable in an up-and-down direction below the peripheral wall member and configured to be capable of closing and opening the lower opening;
   a substrate supporter that supports the substrate between the emission surface and the closing member such that the substrate faces the emission surface;
   a supplier that supplies an inert gas to the processing space with the substrate supported by the substrate supporter in the processing space and the lower opening closed by the closing member in the processing space;

an exhauster that exhausts an atmosphere in the processing space to outside of the processing space with the substrate supported by the substrate supporter and the lower opening closed by the closing member in the processing space; and a plurality of support pins that extend in the up-and-down direction at a position below the processing space and respectively have a plurality of upper ends that are capable of supporting the substrate, wherein the substrate supporter includes a plurality of substrate supporters, the closing member has a flat upper surface facing the emission surface, and the plurality of substrate supporters are attached to the upper surface of the closing member, the closing member has a plurality of through holes into which the plurality of support pins are inserted, and the plurality of support pins are provided such that the upper ends of the plurality of support pins are located at positions farther downward than upper ends of the plurality of substrate supporters when the lower opening is closed by the closing member, and are provided such that the upper ends of the plurality of support pins are located at positions farther upward than the upper ends of the plurality of substrate supporters when the lower opening is opened by the closing member.

9. The exposure device according to claim 8, further comprising a controller that controls the light emitter and the supplier, wherein the controller controls the supplier such that the inert gas is supplied into the processing space at a first flow rate in a predetermined first time that is from a point in time at which the substrate is supported by the substrate supporter in the processing space and the lower opening is closed by the closing member, controls the supplier such that the inert gas is supplied into the processing space at a second flow rate that is lower than the first flow rate in a second time that is from a point in time at which the first time elapses, and controls the light emitter such that the substrate is irradiated with vacuum ultraviolet rays from the emission surface in the second time.

* * * * *